(12) United States Patent
Higa

(10) Patent No.: US 6,918,989 B2
(45) Date of Patent: Jul. 19, 2005

(54) APPARATUS FOR MANUFACTURING PRINTED WIRING BOARD AND METHOD FOR MANUFACTURING PRINTED WIRING BOARD USING THE SAME

(75) Inventor: Kazutomo Higa, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 391 days.

(21) Appl. No.: 09/936,324

(22) PCT Filed: Jan. 11, 2001

(86) PCT No.: PCT/JP01/00085

§ 371 (c)(1),
(2), (4) Date: Dec. 4, 2001

(87) PCT Pub. No.: WO01/52610

PCT Pub. Date: Jul. 19, 2001

(65) Prior Publication Data

US 2002/0157792 A1 Oct. 31, 2002

(30) Foreign Application Priority Data

| Jan. 11, 2000 | (JP) | 2000-002189 |
| Jan. 11, 2000 | (JP) | 2000-002190 |
| Jan. 11, 2000 | (JP) | 2000-002191 |
| Jan. 11, 2000 | (JP) | 2000-002192 |
| Jan. 11, 2000 | (JP) | 2000-002193 |

(51) Int. Cl.$^7$ ............ H01L 21/00; B05B 12/00
(52) U.S. Cl. ............ 156/345.21; 118/718; 138/37
(58) Field of Search ............ 156/345.2, 345.21; 118/718; 138/37

(56) References Cited

U.S. PATENT DOCUMENTS

| 3,706,398 | A | * | 12/1972 | Kato et al. ............ 222/20 |
| 4,233,108 | A | * | 11/1980 | Tamura et al. ............ 216/91 |
| 5,169,477 | A | * | 12/1992 | Seki et al. ............ 156/345.21 |
| 5,228,949 | A | | 7/1993 | Ketelhohn et al. |
| 5,290,384 | A | | 3/1994 | Ketelhohn et al. |
| 5,378,308 | A | * | 1/1995 | Thoms ............ 216/92 |
| 6,066,834 | A | * | 5/2000 | Rebold ............ 219/137.71 |
| 6,117,242 | A | * | 9/2000 | Kreiselmaier ............ 118/712 |
| 6,270,620 | B1 | * | 8/2001 | Chih-Peng ............ 156/345.21 |

FOREIGN PATENT DOCUMENTS

| JP | 3-277784 | 12/1991 |
| JP | 4-48085 | 2/1992 |
| JP | 5-75236 | 3/1993 |
| JP | 5-287558 | 11/1993 |
| JP | 5-309294 | 11/1993 |
| JP | 7-231155 | 8/1995 |
| JP | 8-293660 | 11/1996 |
| JP | 10-18058 | 1/1998 |
| JP | 11-279775 | 10/1999 |

* cited by examiner

*Primary Examiner*—P. Hassanzadel
*Assistant Examiner*—Sylvia R. MacArthur
(74) *Attorney, Agent, or Firm*—Wenderoth, Lind & Ponack, L.L.P.

(57) ABSTRACT

In a manufacturing apparatus of printed wiring board an aperture of a nozzle pipe located in a central position is larger than that at both sides, or the aperture of the piping to the nozzle pipe in the central position is larger than that of the piping at both sides. The mutual interval is narrower with the central nozzle pipes. The interval of the individual nozzle pipes is variable, and is also variable in the vertical direction. A pressure-proof flexible tube is provided between each nozzle pipe and the pump, and the interval of the individual nozzle pipes is variable, and is also variable in the vertical direction. Further, the spray pressure, oscillating angle, and oscillating speed can be set individually in each nozzle pipe, and such setting can be automated.

19 Claims, 21 Drawing Sheets

(a)

(b)

(a)

515a 515b 515 515d 515e 515f (b)

515a 515b 515c 515d 515e 515f (a)

515a 515b 515c 515d 515e 515f (b)

515a 515b 515c 515d 515e 515f

APPARATUS FOR MANUFACTURING PRINTED WIRING BOARD AND METHOD FOR MANUFACTURING PRINTED WIRING BOARD USING THE SAME

DESCRIPTION

Manufacturing apparatus of printed wiring board, and manufacturing method of printed wiring board using the same

TECHNICAL FIELD

The present invention relates to a manufacturing apparatus of printed wiring board used in various electronic appliances.

BACKGROUND ART

Recently, as the electronic appliances are becoming smaller in size and diversified in function, printed wiring boards widely used in such electronic appliances are required to be higher in wiring density and higher in reliability.

A conventional manufacturing apparatus used in forming conductor patterns in printed wiring boards, especially an etching apparatus is explained.

FIG. 21 is a schematic view of a conventional etching apparatus as a manufacturing apparatus of printed wiring boards. In FIG. 21, plural upper surface nozzle pipes 632 and plural lower surface nozzle pipes 633 disposed in an etching booth 641 are respectively provided with a plurality of spray nozzles 631.

An upper surface spray pump 638 supplies an etchant into an upper surface nozzle pipe 632 through an upper surface pressure regulating valve 636. A lower surface spray pump 639 supplies an etchant into a lower surface nozzle pipe 633 through a lower surface pressure regulating valve 637. The pressure of the etchant is checked respectively at an upper surface pressure gauge 634 and a lower surface pressure gauge 635. A feed roller 640 is used to convey a printed wiring board 642 in a running direction.

In the conventional etching apparatus having such structure, an etching method of printed wiring board is explained below.

First, a printed wiring board 642 forming an etching resist by screen printing method or photographic method on a copper lined laminate board (not shown) cut in specified size is conveyed into an etching booth 631 between plural upper surface nozzle pipes 632 and plural lower surface nozzle pipes 633 disposed parallel to or at a certain angle to the running direction of the printed wiring board 642, and conveyed on a roller 640 at a specified speed in the running direction, and sprayed with an etchant as a treating solution such as cupric chloride on both upper and lower surfaces by means of spray nozzles 631 to dissolve (etch) the exposed copper in the etching resist non-forming area, and a conductor pattern is obtained. At this time, the upper surface nozzle pipes 632 and lower surface nozzle pipes 633 can be oscillated at an angle of 45° to 60° to the running direction of the printed wiring board 642. Later, through the etching resist stripping, washing and drying steps, a conductor pattern is formed from the copper lined laminate board.

In such conventional etching apparatus and etching method, it is difficult to etch the copper precisely and uniformly on both upper and lower surfaces, and in particular the etching speed is likely to differ substantially between the upper surface and lower surface of the printed wiring board. That is, on the upper surface of the printed wiring board, deteriorated etchant containing much dissolved copper is likely to collect in the central area, but the deteriorated etchant in the peripheral area immediately flows down from the printed wiring board and is not collected, while on the lower surface of the printed wiring board, the etchant does not stay, and the fresh etchant having a high etching capability is always supplied on the lower surface.

As a result, a significant difference occurs in the etching precision of conductor pattern between the central area and peripheral area of the upper surface of the printed wiring board, and the difference is much greater between the upper surface and lower surface, and it is extremely difficult to etch the conductor pattern of printed wiring board of high density and high precision, and the process yield is extremely lowered, and this problem is more notable when the thickness of the printed wiring board is smaller and the density of the conductor pattern is higher.

To solve these problems, hitherto, it has been attempted to incline the printed wiring board or set upright, and inject the etchant from the spray nozzles in the horizontal direction, and various methods for eliminating retention of etchant have been proposed, but it is difficult to convey the printed wiring board and set the etching condition, and the productivity is significantly impaired, and the manufacturing cost of the manufacturing apparatus is soaring, and it is not widely employed at the present.

SUMMARY OF THE INVENTION

A manufacturing apparatus of printed wiring board of the invention comprises a feed roller for conveying a printed wiring board at a specified speed, plural nozzle pipes mounting a plurality of spray nozzles and disposed nearly at uniform intervals parallel to or at a certain angle to the running direction of the printed wiring board, a mechanism for oscillating the nozzle pipes, and a pump for supplying a treating solution to the nozzle pipes, in which the plural nozzle pipes are composed of nozzle pipes having different apertures, or plural piping pipes are disposed between the plural nozzle pipes and the pump, and in particular the aperture of the nozzle pipe positioned in the center is larger than the aperture of the nozzle pipes at both sides, or the aperture of the piping pipe connected to the nozzle pipe in the center is larger than the aperture of the piping pipes at both sides.

A manufacturing method of a printed wiring board of the invention is to manufacture a printed wiring board by using such manufacturing apparatus of printed wiring board.

According to such manufacturing apparatus and manufacturing method, by the nozzle pipes of different apertures, or by the piping pipes of different apertures, the flow rate distribution of the treating solution sprayed from the spray nozzles to the printed wiring board can be set so as not to be stagnant on the printed wiring board, and etching of high precision is realized, and further the printed wiring board can be conveyed easily at specified speed, so that the manufacturing apparatus can be presented without lowering the productivity or hiking the apparatus manufacturing cost.

A manufacturing apparatus of printed wiring board in another aspect of the invention comprises a feed roller for conveying a printed wiring board at a specified speed, plural nozzle pipes mounting a plurality of spray nozzles and disposed at specified intervals parallel to or at a certain angle to the running direction of the printed wiring board, a mechanism for oscillating the nozzle pipes, a pump for supplying an etchant as a treating solution to the nozzle pipes, and a pressure regulating valve and a pressure gauge connected in an individual passage between the pump and each nozzle pipe, in which nozzle pipes are disposed at narrower intervals at central positions among other plural nozzle pipes.

According to this manufacturing apparatus, the etching speed is uniform in the central area and peripheral area, and upper surface and lower surface of the printed wiring board, so that a conductor pattern of high precision can be formed.

A manufacturing method of a printed wiring board using this manufacturing apparatus is characterized by setting so that the indication of the pressure gauge of the nozzle pipe in the center may be higher than the indication of the pressure gauges of the nozzle pipes at both sides by controlling the opening degree of the individual pressure regulating valves, oscillating the nozzle pipes at a constant angle, and etching by conveying at a specified speed while spraying the etchant to the printed wiring board.

In this apparatus, since the nozzle pipes are disposed at narrower intervals at central positions on the upper surface, in order that the etchant may flow down immediately without staying in the center of the upper surface by increasing the amount of the etchant sprayed to the center on the printed wiring board, the pressure of the central nozzle pipe may be set higher than the pressure of the nozzle pipes at both sides easily by controlling the opening degree of the pressure regulating valves while observing the indication of the pressure gauges.

Accordingly, the etching speed is made uniform in the central area and peripheral area and on the upper surface and lower surface, and a conductor pattern of high precision is formed, so that a simple etching apparatus of a printed wiring board is presented without lowering the productivity or hiking the apparatus manufacturing cost.

A manufacturing apparatus of printed wiring board in a different aspect of the invention comprises a feed roller for conveying a printed wiring board at a specified speed, plural nozzle pipes mounting a plurality of spray nozzles and disposed parallel to or at a certain angle to the running direction of the printed wiring board, a mechanism for oscillating the nozzle pipes, and a pump for supplying an etchant as a treating solution to the nozzle pipes, in which the mechanism for oscillating the nozzle pipes is disposed independently in each nozzle pipe.

In this configuration, depending on the position of the nozzle pipe, the conditions of the oscillating angle and oscillating speed of nozzle pipes can be set independently in individual nozzle pipes. As a result, the flow of the etchant on the printed wiring board may be set so that the etching force may be uniform.

A manufacturing method of printed wiring board using this manufacturing apparatus of printed wiring board is characterized by setting the oscillating angle of the central nozzle pipe smaller than the oscillating angle of the nozzle pipes at both sides, setting the oscillating speed higher, and conveying at a specified speed while spraying the etchant to the printed wiring board, thereby etching the printed wiring board.

Accordingly, by increasing the spraying amount and flow rate of the etchant as the treating solution in the central part on the upper surface of the printed wiring board, the etchant in the central area of the upper surface does not stay still but immediately flows down, and therefore the etching speed is uniform in the central area and peripheral area and on the upper surface and lower surface, so that a conductor pattern of high precision may be formed.

A manufacturing apparatus of printed wiring board in a further aspect of the invention comprises a feed roller for conveying a printed wiring board at a specified speed, plural nozzle pipes mounting a plurality of spray nozzles and disposed parallel to or at a certain angle to the running direction of the printed wiring board, a mechanism for oscillating the nozzle pipes, a pump for supplying an etchant as a treating solution to the nozzle pipes, and a pressure-proof flexible tube disposed between each one of the plural nozzle pipes and the pump.

Accordingly, since the pressure-proof flexible tube is disposed between each nozzle pipe and pump, the interval between nozzle pipes and moving of position in the vertical direction are free, and the etching apparatus easy in condition setting of printed wiring board where high precision is required can be presented.

A manufacturing method of printed wiring board using this apparatus is characterized by etching a printed wiring board by oscillating the nozzle pipes at a specified oscillating angle and oscillating speed, and conveying at specified speed while blowing etchant to the printed wiring board, by using the manufacturing apparatus of printed wiring board capable of varying the interval of individual nozzle pipes, or varying in the vertical direction.

Accordingly, by setting narrower the interval of the central nozzle pipes, the amount of etchant sprayed to the central area on the printed wiring board is increased, and by bringing the position of the central nozzle pipes closer to the board conveying surface side, the impingement of the etchant on the central area of the printed wiring board is set stronger than that of the peripheral area, so that the etchant flows down efficiently and promptly without staying in the upper surface central area of the printed wiring board, and the etching speed is uniform in the central area and peripheral area and on the upper surface and lower surface, so that a conductor pattern of higher precision is formed.

A manufacturing apparatus of printed wiring board in a further different aspect of the invention comprises a feed roller for conveying a printed wiring board at a specified speed, plural nozzle pipes mounting a plurality of spray nozzles and disposed parallel to or at a certain angle to the running direction of the printed wiring board, a mechanism for oscillating the nozzle pipes, plural pumps for supplying an etchant as a treating solution to the nozzle pipes, the plural pumps corresponding to the nozzle pipes, and a pressure gauge connected in an individual passage between each nozzle pipe and the pump, in which the output of each pump is controlled by an inverter circuit or a current or voltage control circuit.

Accordingly, since the etchant flows down immediately without staying in the central area of the upper surface of the printed wiring board, by controlling the pump output while observing the indication of the pressure gauge easily to set the pressure of the central nozzle pipe higher than the pressure of the nozzle pipes at both sides, the etching apparatus capable of setting the conditions of the printed wiring board where high precision is required easily and automatically can be presented.

A manufacturing method of printed wiring board using this apparatus is characterized by etching a printed wiring board by conveying at specified speed while blowing etchant as a treating solution to the printed wiring board by oscillating the nozzle pipes at a constant angle, by controlling the output of each pump so that the indication of the pressure gauge of the central nozzle pipe may be higher than the indication of the pressure gauges of the nozzle pipes at both sides.

Accordingly, the pressure of the central nozzle pipe may be easily set so as to be higher than the pressure of the nozzle pipes at both sides, and the etchant flows down efficiently and promptly without staying in the central area of the upper surface of the printed wiring board, and the etching speed is uniform in the central area and peripheral area and on the upper surface and lower surface, so that a conductor pattern of higher precision is formed.

The manufacturing apparatus of printed wiring board having such configuration may be modified as follows in order to automate setting of the etching condition. That is, in the case of having N nozzle pipes for processing a printed wiring board, it comprises means for dividing at least into N regions by a dividing line parallel in the running direction of the printed wiring board beforehand and storing data of processing area of each divided block, means for storing correction data of each nozzle pipe, means for selecting correction data corresponding to each divided block as output data, means for calculating the final output data to each spray pump from the selected output data, and means for controlling the spray pump output corresponding to the final output data.

By this manufacturing apparatus and the manufacturing method using the same, the printed wiring board is divided into N regions parallel in the running direction, and depending on the processing area of each region, that is, the etching area, and the etching force by the piping position of nozzle pipes, by controlling the pressure setting of each nozzle pipe by the pump output, the etching condition can be set automatically.

BEST MODE FOR CARRYING OUT THE INVENTION (Embodiment 1)

Figure 1:
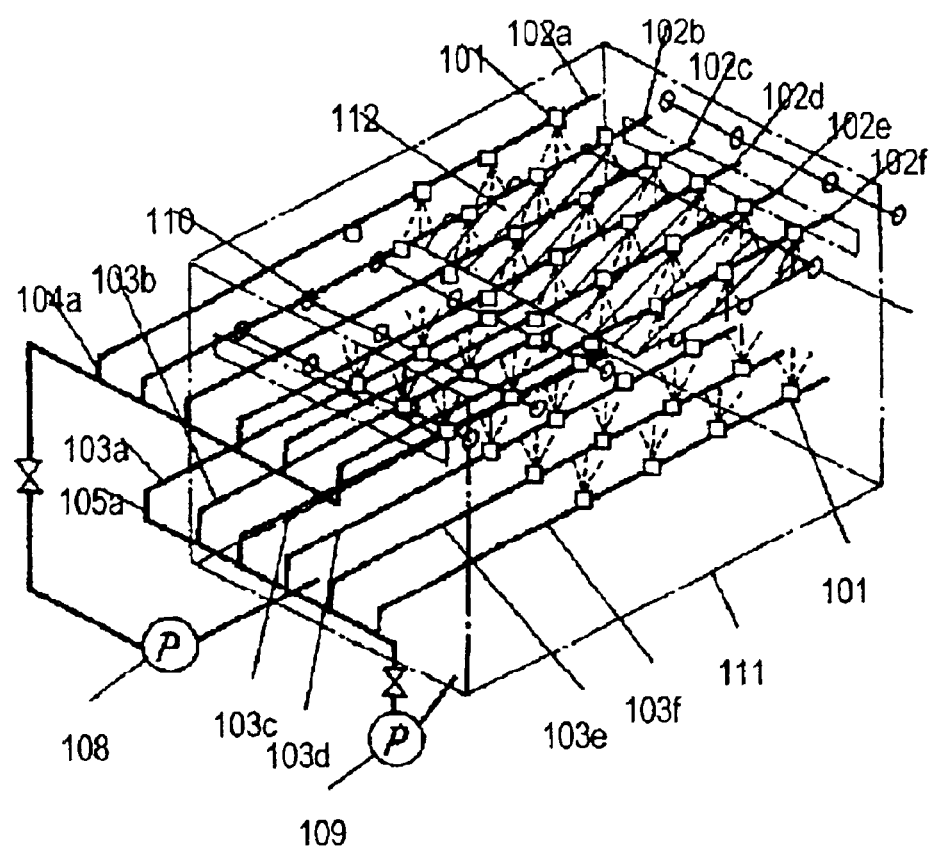
FIG. 1 is an outline diagram of a manufacturing apparatus of printed wiring board in embodiment 1 of the invention.

Embodiment 1 of the invention is described by referring to the accompanying drawings. FIG. 1 shows an outline of a manufacturing apparatus of printed wiring board in embodiment 1 of the invention, and FIG. 2 is a schematic diagram showing the detail of the manufacturing apparatus in embodiment 1 of the invention.

In FIG. 1, plural upper surface nozzle pipes 102a to 102f disposed nearly at equal intervals in an etching booth 111 are individually provided with a plurality of spray nozzles 101, and are disposed parallel to or at a certain angle to the running direction of the printed wiring board. Similarly, plural lower surface nozzle pipes 103a to 103f disposed nearly at equal intervals in the etching booth 111 are individually provided with a plurality of spray nozzles 101, and are disposed parallel to or at a certain angle to the running direction of the printed wiring board. An upper surface spray pump 108 supplies an etchant to the nozzle pipes 102a to 102f A lower surface spray pump 109 supplies an etchant to the nozzle pipes 103a to 103f. A feed roller 110 conveys a printed wiring board 112 at a specified speed.

In this configuration, the aperture of the central nozzle pipes 102c, 102d, 103c, 103d is about 20 to 30% larger than that of the nozzles pipes at both sides 102a, 102b, 102e, 102f.

Figure 2:
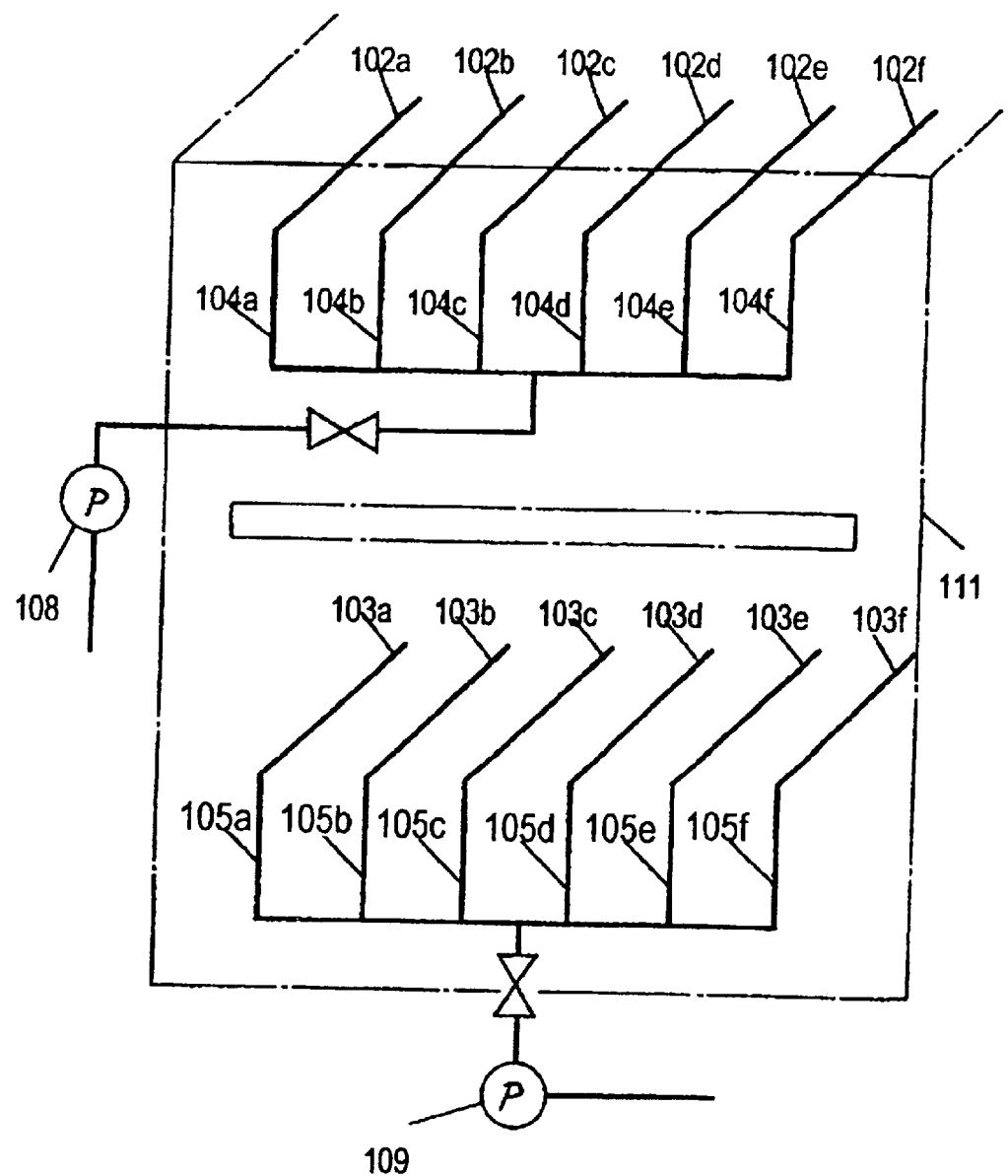
FIG. 2 is a schematic diagram showing the detail of the manufacturing apparatus in embodiment 1 of the invention.

In FIG. 2, piping pipes 104a to 104f are disposed between the upper surface spray pump 108 and upper surface nozzle pipes 102a to 102f. Piping pipes 105a to 105f are disposed between the lower surface spray pump 109 and lower surface nozzle pipes 103a to 103f Herein, the aperture of the piping pipes 104c, 104d, and 105c, 105d connected to the central nozzle pipes 102c, 102d, and 103c, 103d is about 20 to 30% larger than that of the piping pipes at both sides 104a, 104b and 105e, 105f.

In the manufacturing apparatus having such configuration, the etching method of printed wiring board is explained below.

First, a printed wiring board 112 is prepared by forming an etching resist by screen printing method or photographic method on a copper lined laminate board (not shown) cut in a specified size and having a copper foil of 35 $\mu$m in thickness formed on both sides of an insulating substrate.

This printed wiring board 112 is conveyed into the etching booth 111 between the upper surface nozzle pipes 102a to 102f and lower surface nozzle pipes 103a to 103f disposed parallel to or at a certain angle to the running direction, at a specified speed on the feed roller 110, and is etched by blowing an etchant such as cupric chloride on both upper and lower surfaces from spray nozzles 101.

At the time of etching, the upper surface nozzle pipes 102a to 102f and lower surface nozzle pipes 103a to 103f are oscillated at an angle of 45° to 60° within a plane at right angle to the running direction of the printed wiring board in the blowing direction of the spray nozzles on the axis of rotation of the axis of each nozzle pipe. For this oscillation, a joint for rotating only the nozzle pipes is needed so as not to leak the etchant at the junction from the spray pump to each nozzle pipe, but it is not shown in the diagram. To control the flow rate of the etchant supplied from the upper surface spray pump 108 to the upper surface nozzle pipes 102a to 102f, in proportion to the aperture of the nozzle pipe, the aperture of the central nozzle pipes 102c, 102d, 103c, 103d is increased by about 20 to 30% as compared with that of the nozzle pipes at both sides 102a, 102b and 103e, 103f, and hence the etchant in the central area of the upper surface of the printed wiring board does not stay still but immediately flows down from both sides, so that the entire surface of the printed wiring board may be always etched with a fresh etchant.

By executing etching by setting the aperture of the nozzle pipes, as compared with the conventional etching apparatus and etching method, in which fluctuations of the conductor pattern width after etching are about 50 to 100 μm of the set values in the upper surface and lower surface, and in the central part and peripheral part of the printed wiring board, fluctuations are extremely decreased to 10 to 20 μm in the etching apparatus and etching method of the invention.

This principle brings about the same effect, as shown in FIG. 2, when the aperture of the piping pipes 104c, 104d, 105c, 105d is set about 20 to 30% larger than that of the piping pipes at both sides 104a, 104b and 105e, 105f, and in this case, more particularly, modification of the conventional etching apparatus, and replacement or mounting when changing the aperture of piping pipes can be executed more easily and inexpensively.

In embodiment 1, only the nozzle pipes and piping pipes in the central area are set larger in aperture, but the nozzle pipes 102b, 102e, 103b, 103e, and piping pipes 104b, 104e, 105b, 105e being adjacent to the central nozzle pipes and piping pipes may be also set larger in aperture by 10 to 20% as compared with that of the remotest side nozzle pipes and piping pipes, and the same effects are obtained.

In particular, in embodiment 1, among the manufacturing apparatuses of printed wiring boards, the etching apparatus for etching of copper foil is explained, but the invention may be similarly applied also in the developing apparatus for developing and removing unexposed portion of photosensitive resist.

(Embodiment 2)

Figure 3:
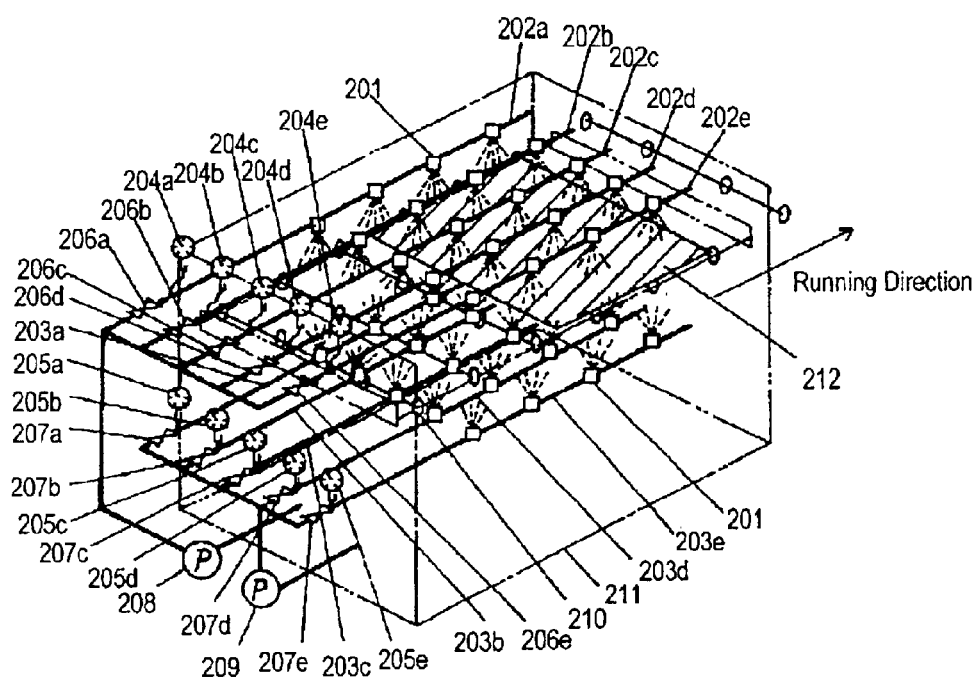
FIG. 3 is an outline diagram of a manufacturing apparatus of printed wiring board in embodiment 2 of the invention.

Embodiment 2 of the invention is described by referring to the accompanying drawings. FIG. 3 is an outline diagram of a manufacturing apparatus of printed wiring board in embodiment 2 of the invention, and FIG. 4 is a detailed diagram of the manufacturing apparatus of printed wiring board in embodiment 2 of the invention.

In FIG. 3, plural upper surface nozzle pipes 202a to 202e disposed in an etching booth 211 are individually provided with a plurality of spray nozzles 201, and are disposed parallel to or at a certain angle to the running direction of the printed wiring board. Similarly, plural lower surface nozzle pipes 203a to 203e are individually provided with a plurality of spray nozzles 201, and are disposed parallel to or at a certain angle to the running direction of the printed wiring board. An upper surface spray pump 208 supplies an etchant to the nozzle pipes 202a to 202e through upper surface pressure regulating valves 206a to 206e as means for regulating the spray pressure. Upper surface pressure gauges 204a to 204e monitor the pressure of the nozzle pipes 202a to 202e after passing through the upper surface pressure regulating valves 206a to 206e. A lower surface spray pump 209 supplies an etchant to the nozzle pipes 203a to 203e through lower surface pressure regulating valves 207a to 207e as means for regulating the spray pressure. Lower surface pressure gauges 205a to 205e monitor the pressure of the nozzle pipes 203a to 203e after passing through the lower surface pressure regulating valves 207a to 207e. A feed roller 210 conveys a printed wiring board 212 in the running direction.

Figure 4:
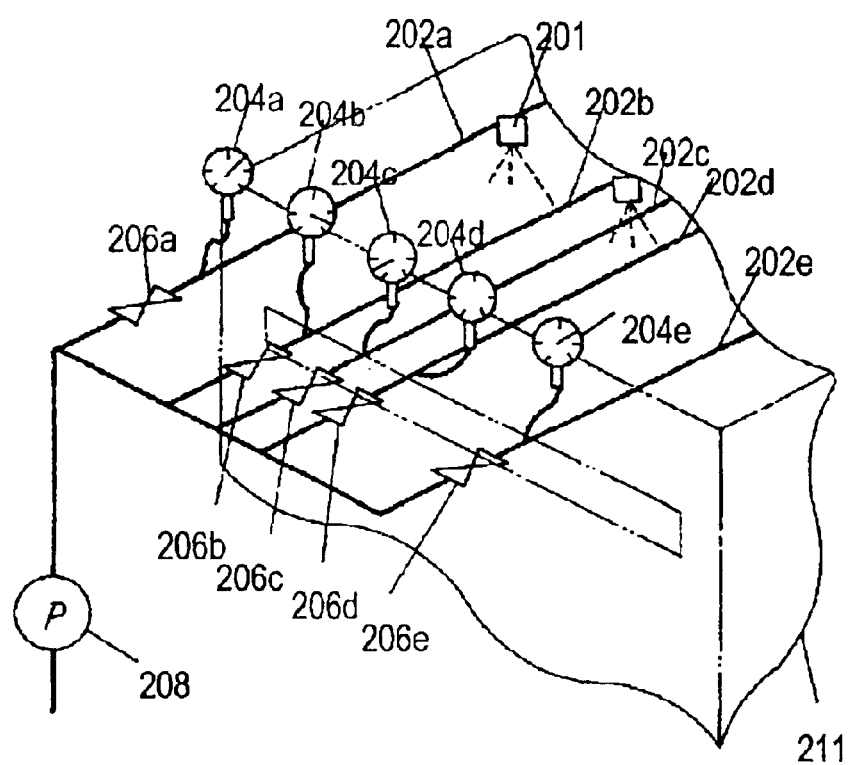
FIG. 4 is a detailed diagram of the manufacturing apparatus of printed wiring board in embodiment 2 of the invention.

The etching apparatus as the manufacturing apparatus of printed wiring board having such configuration is as shown in FIG. 4, in which the interval of the central nozzle pipes 202c and 202b, and 202c and 202d is about 10 to 30% narrower than the interval of other nozzle pipes 202a and 202b, and 202d and 202e, and in this structure, therefore, the amount of etchant blown to the central part on the printed wiring board can be increased.

In this example, the number of nozzle pipes is five, 202a to 202e, but in the case of six pipes 202a to 202f (not shown), the interval of the central pipes 202c and 202d is about 30 to 50% narrower than the interval of other nozzle pipes 202a and 202b, and 202e and 202f, and as required, the interval of the nozzle pipes closer to the center 202b and 202c, and 202d and 202e may be set about 10 to 30% narrower.

In the etching apparatus having such configuration, the etching method of printed wiring board is explained below.

First, a printed wiring board 212 is prepared by forming an etching resist by screen printing method or photographic method on a copper lined laminate board (not shown) cut in a specified size and having a copper foil of 35 μm in thickness formed on both sides of an insulating substrate.

This printed wiring board 212 is conveyed into the etching booth 211 between the upper surface nozzle pipes 202a to 202e and lower surface nozzle pipes 203a to 203e disposed parallel to or at a certain angle to the running direction, at a specified speed on the feed roller 210, and is etched by blowing an etchant such as cupric chloride on both upper and lower surfaces from spray nozzles 201. At the time of etching, the upper surface nozzle pipes 202a to 202e and lower surface nozzle pipes 203a to 203e are oscillated at an angle of 45° to 60° within a plane at right angle to the running direction of the printed wiring board, and the etchant supplied from the upper surface spray pump 208 to the upper surface nozzle pipes 202a to 202e is regulated by the opening degree of the upper surface pressure regulating valves 206a to 206e, and the spray pressure indicated on upper surface pressure gauges 204a to 204e is adjusted. Similarly, the etchant supplied from the lower surface spray pump 209 to the lower surface nozzle pipes 203a to 203e is regulated by the opening degree of the lower surface pressure regulating valves 207a to 207e, and the spray pressure indicated on lower surface pressure gauges 205a to 205e is adjusted.

Herein, the pressure indicated on upper surface pressure gauges 204a to 204e is adjusted by the opening degree of the upper surface pressure regulating valves 206a to 206e so that the pressure may be high in the central nozzle pipe, that is, 1.2 kg/cm$^2$ in the gauge 204a, 1.6 kg/cm$^2$ in the gauge 204$b$, 2.0 kg/cm$^2$ in the gauge 204$c$, 1.6 kg/cm$^2$ in the gauge 204$d$, and 1.2 kg/cm$^2$ in the gauge 204$e$.

Similarly, the pressure indicated on lower surface pressure gauges 205$a$ to 205$e$ is adjusted by the opening degree of the lower surface pressure regulating valves 207$a$ to 207$e$, that is, 1.0 kg/cm$^2$ in the gauge 205$a$, 0.9 kg/cm$^2$ in the gauge 205$b$, 0.8 kg/cm$^2$ in the gauge 205$c$, 0.9 kg/cm$^2$ in the gauge 205$d$, and 1.0 kg/cm$^2$ in the gauge 205$e$.

In this setting, the pressure setting value of the central nozzle pipe 204$c$ is somewhat higher but the pressure balance is relatively moderate because the piping interval of the central nozzle pipes is narrow and the amount of etchant injected to the central area on the printed wiring board is relatively larger than in the peripheral area so that the setting may be somewhat lower as compared with the case of equal piping interval of nozzle pipes.

It brings about the following merits. Injection pressure to plural nozzles attached to each nozzle pipe is not extremely low, and probability of trouble due to clogging of foreign matter in the etchant injection port of the nozzle can be lowered. Moreover, since the pressure at both sides is low, the fluid loss due to closing of pressure regulating valve and narrowing of etchant passage can be lowered, and the energy efficiency is enhanced.

When the pressure gauge and pressure regulating valve of the embodiment are replaced by the flow meter and flow rate regulating valve, respectively, the operation is as follows. The flow rate regulating valve generally has graduations for adjustment of flow rate, and it is same as the pressure regulating valve in its principle. In the explanation of the embodiment of the invention, the pressure regulating valve and flow rate regulating valve are handled differently.

In the case of the setting on the basis of the indication on pressure gauge of each nozzle pipe by using the pressure regulating valve, when the nozzle shape and number of nozzles are changed, the etching flow rate per unit time blown on the printed wiring board may differ. That is, when the etchant injection port of the nozzle is small, if the pressure gauge indicates the same, the flow rate of the etchant injected onto the printed wiring board is smaller as compared with the case of a large injection port. Accordingly, when the nozzle is clogged with foreign matter, the pressure of the pressure gauge elevates, but the flow rate of the etchant decreases. It is actually difficult to detect nozzle clogging during production.

When managed by the pressure only, in order to lower the indication of the pressure gauge, the pressure regulating valve is controlled in the closing direction, but the flow rate blown onto the printed wiring board is further decreased at this time, and such contradictory conditions may be set.

Further, the etching apparatus generally comprises, in order to remove foreign matter, a filter installed between the spray pump and nozzle pipe, or between the etchant reservoir in the bottom of the etching apparatus main body and the spray pump. When this filter is filled with foreign matter, possibly exceeding a certain limit, the indication of the pressure gauge drops.

However, when the spray nozzle is clogged with foreign matter and the filter is filled with foreign matter at the same time, the elevation of the indication of the pressure gauge due to clogging of the spray nozzle with foreign matter and the decline of the indication of the pressure gauge due to filling of the filter with foreign matter may be in equilibrium, and the pressure gauge may indicate the same value as the initial correct setting. In this case, actually, the flow rate of the etchant blown onto the printed wiring board is extremely decreased due to the decrease of flow rate due to clogging of the spray nozzle and decrease of the flow rate due to clogging of filter, and in an extreme case, the flow rate of the etchant may not reach the level for etching the thickness of the copper sufficiently, and the copper layer be left.

To solve such problem, by setting the conditions with the flow meter and flow rate regulating valve, if pressure changes occur due to clogging of the nozzle or clogging of the filter, the flow rate of the etchant per unit time blown onto the printed wiring board may be kept constant, and the printed wiring board may be manufactured in stable condition.

By etching according to such setting of spray pressure and flow rate, as compared with the conventional etching apparatus and etching method, in which the conductor pattern width after etching fluctuates about 50 to 100 $\mu$m from the setting value in the upper and lower surfaces and in the central area and peripheral area of the printed wiring board, it is proved that the fluctuations are extremely decreased to about 10 to 20 $\mu$m in the etching apparatus and etching method of the invention.

In the embodiment of the invention, the printed wiring board is a two-sided printed wiring board without through hole plating, but it may be also applied in a one-sided printed wiring board, a two-sided printed wiring board with through hole plating, or a multilayer printed wiring board, and the etching resist is an organic material formed by screen printing method or photographic method, but solder or other metal resist or photosensitive electrodeposition resist may be used. The etchant is cupric chloride, but ferric chloride, ammonia or other alkaline etchant may be also used.

The copper lined laminate board is prepared by cutting to a specified size and forming 35 $\mu$m thick copper foils on both sides of an insulating substrate, but it is evident from the configuration of the invention that it is easily applied in various board sizes or different etching precisions or conductor thicknesses by adjusting the set pressure.

Further, in the embodiment of the invention, among the manufacturing apparatuses of printed wiring boards, the etching apparatus for etching of copper foil is explained, but the invention may be similarly applied also in a developing apparatus for developing and removing unexposed portions of photosensitive resist.

(Embodiment 3)

Figure 5:
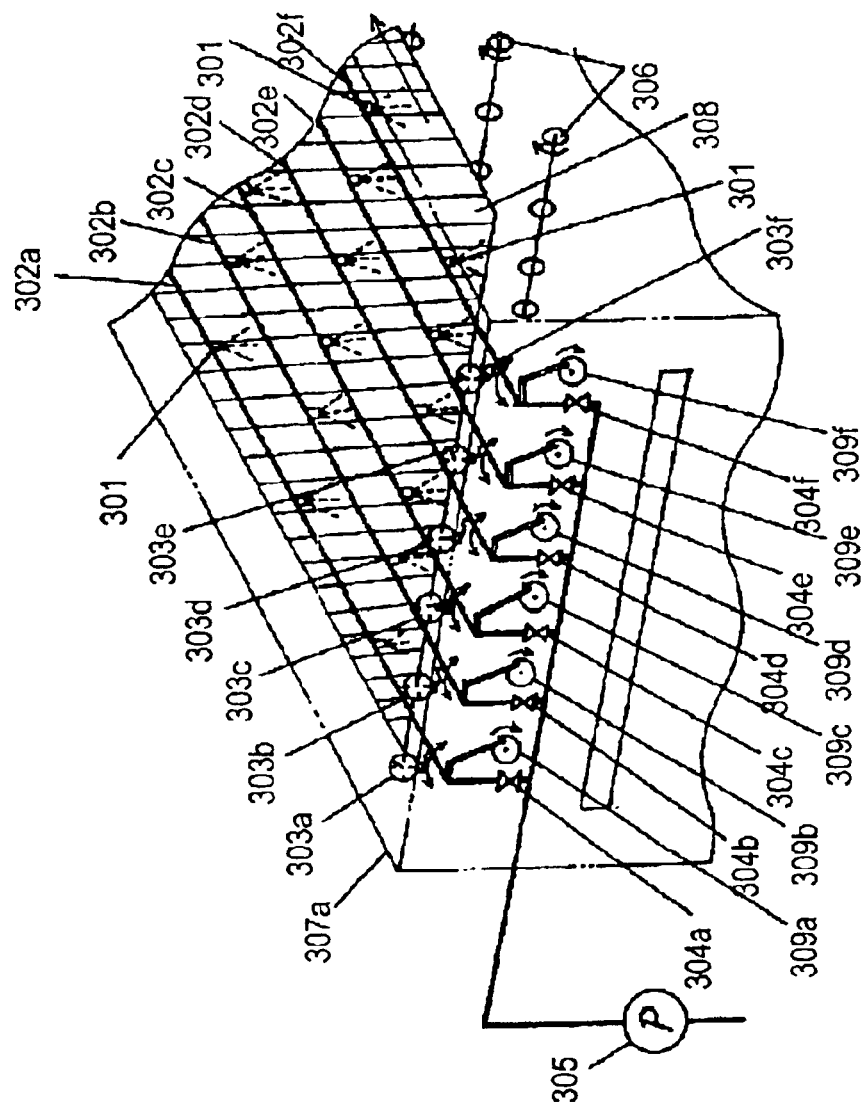
FIG. 5 is an outline diagram of a manufacturing apparatus of printed wiring board in embodiment 3 of the invention.
Figure 6:
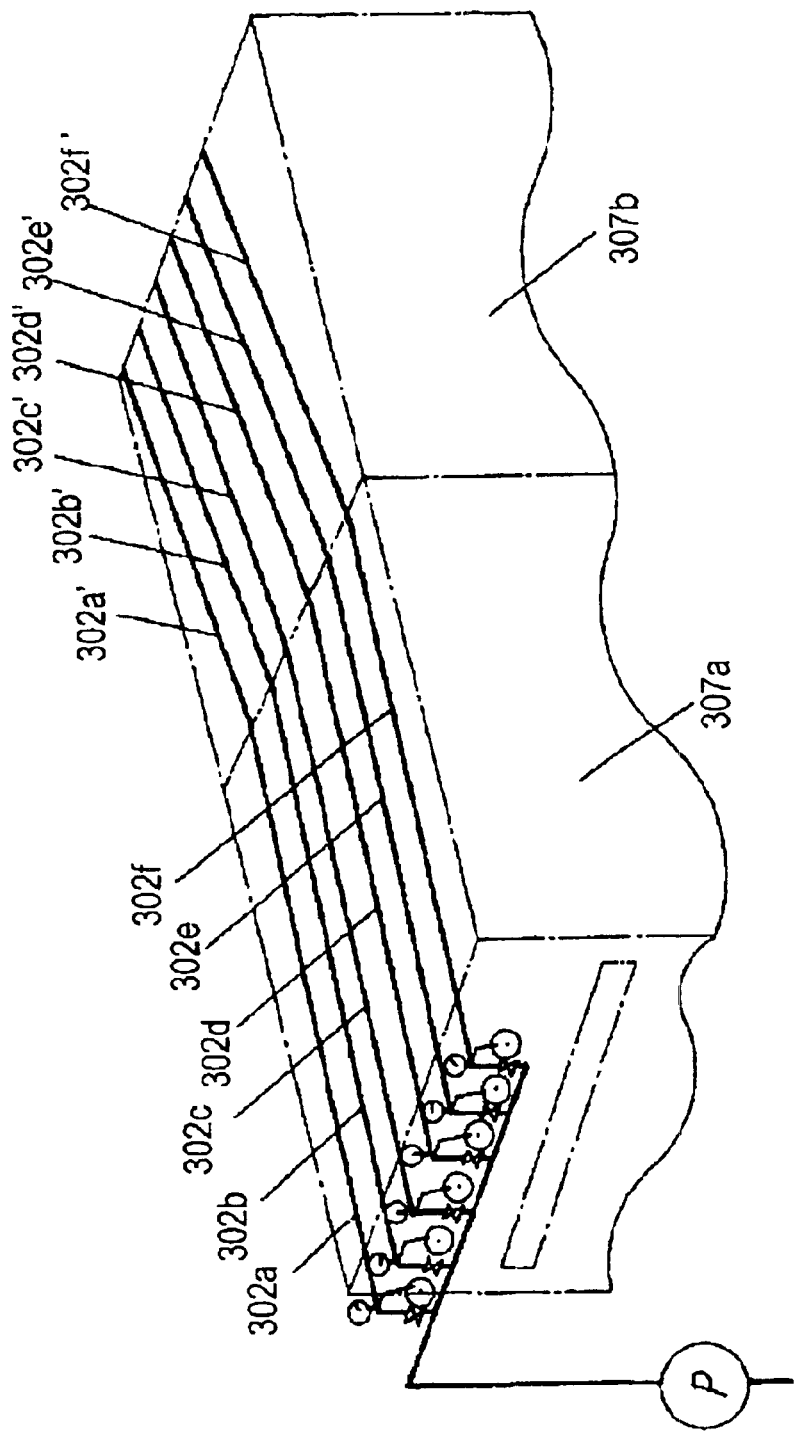
FIG. 6 is an outline diagram of the manufacturing apparatus of printed wiring board in embodiment 3 of the invention.
Figure 7:
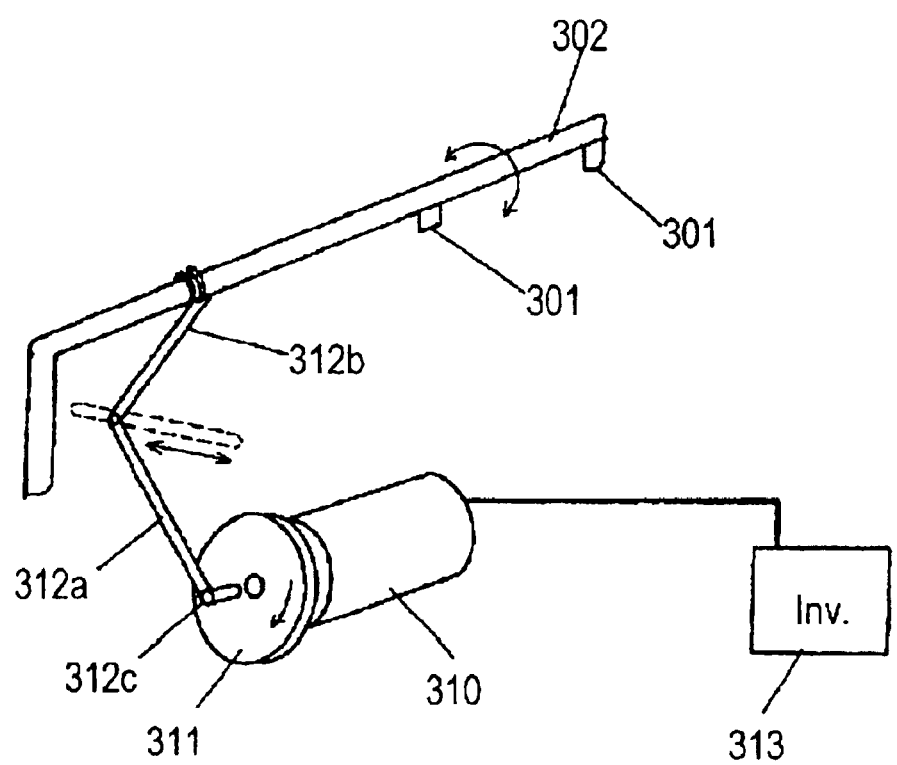
FIG. 7 is a detailed diagram of an oscillating mechanism of nozzle pipes of the manufacturing apparatus in embodiment 3 of the invention.

Embodiment 3 of the invention is described by referring to the accompanying drawings. FIG. 5 and FIG. 6 are outline diagrams of an etching apparatus as a manufacturing apparatus of printed wiring board in embodiment 3 of the invention, and FIG. 7 is a detailed diagram of an oscillating mechanism of nozzle pipes of the manufacturing apparatus in the embodiment of the invention.

An etching apparatus is explained as the manufacturing apparatus of printed wiring board in embodiment 3 of the invention.

The configuration of the etching apparatus in embodiment 3 of the invention is similar to a conventional apparatus for etching from both upper surface and lower surface simultaneously, and the upper structure and lower structure are basically the same. For the ease of explanation of the invention, therefore, only the upper structure is explained by referring to the drawings.

As shown in FIG. 5, upper surface nozzle pipes 302$a$ to 302$f$ are disposed parallel to or at an angle of 1 to 5° to the running direction of a printed wiring board 308 to be conveyed by a feed roller 306 into a first etching booth 307$a$ as a first treating booth. The upper surface nozzle pipes are provided with upper surface pressure regulating valves 304$a$ to 304$f$ as means for regulating the spray pressure from an upper surface spray pump 305 for supplying an etchant as treating solution. The nozzle pipes are also provided with upper surface pressure gauges 303a to 303f, and the nozzle pipes are further equipped with independent oscillating mechanisms 309a to 309f for individual upper surface nozzle pipes.

FIG. 6 shows two etching booths, that is, a second etching booth 307b as a second treating booth aside from the first etching booth 307a, and in the first etching booth 307a, upper surface nozzle pipes 302a to 302f are disposed at an angle of 1 to 5° to the running direction of the printed wiring board 308, and in the second etching booth 307b, upper surface nozzle pipes 302a' to 302f are disposed at an angle of 1 to 5° in the reverse direction of the nozzle pipes in the first etching booth.

FIG. 7 shows the detail of an independent oscillating mechanism of a pipe in the embodiment 3 of the invention.

An independent oscillating mechanism for each nozzle pipe comprises a cam (rotating disk) 311 and link mechanisms 312a, 312b, and the oscillating angle can be varied by moving positions of the fulcrum 312c of the link mechanism on the rotating disk. The cam 311 is directly coupled to a control motor 310, or is interlocked by belt or gear, and the control motor 310 is easily changed in the rotating speed by means of an inverter circuit 313.

In this configuration, in each nozzle pipe, the oscillating angle and oscillating speed can be varied independently.

When changing only the oscillating angle in each nozzle pipe and keeping the oscillating speed the same, only one control motor 310 is used, and the equipment cost can be saved.

In the etching apparatus having such configuration, the etching method of printed wiring board is explained below.

The condition setting is explained in the etching apparatus using only the first etching booth 307a of printed wiring board in FIG. 5 relating to embodiment 3 of the invention.

First, the oscillating angle of the central nozzle pipes 303c and 303d is set smaller than the oscillating angle of the other nozzle pipes 303a and 303b, and 303e and 303f, by moving the position of the fulcrum 312c of the link mechanism in the oscillating mechanism shown in FIG. 7. Further, the oscillating speed of the central nozzle pipes 303c and 303d is set larger than that of the other nozzle pipes 303a and 303b, and 303e and 303f, by means of the inverter circuit 313 or current or voltage control circuit.

As a result, by increasing the spraying amount and flow rate of the etchant in the central area on the printed wiring board, the etchant does not stay in the central area of the upper surface, but immediately flows down.

Prior to treatment by this apparatus, a printed wiring board 308 is prepared by forming an etching resist by screen printing method or photographic method on a copper lined laminate board (not shown) cut in a specified size and having a copper foil of 35μm in thickness formed on both sides of an insulating substrate.

This printed wiring board 308 is conveyed into the etching booths 307a, 307b between the upper surface nozzle pipes 302a to 302f and lower surface nozzle pipes not shown disposed parallel to or at a certain angle to the running direction, at a specified speed on the feed roller 306, and is etched by blowing an etchant such as cupric chloride on both upper and lower surfaces from spray nozzles 301. At the time of etching, the upper surface nozzle pipes 302a to 302f and lower surface nozzle pipes are oscillated at independent oscillating angles and oscillating speeds individually, to the running direction of the printed wiring board, by setting the oscillating angle at 45° for the central nozzle pipes 302c and 302d, and 60° for the other nozzle pipes 302a and 302b, and 302e and 302f, and the etchant supplied from the upper surface spray pump 305 to the upper surface nozzle pipes 302a to 302f is regulated by the opening degree of the upper surface pressure regulating valves 304a to 304f, and the spray pressure indicated on upper surface pressure gauges 303a to 303f is adjusted.

Similarly, the etchant supplied from the lower surface spray pump not shown to the lower surface nozzle pipes is regulated by the opening degree of the lower surface pressure regulating valves not shown, and the spray pressure indicated on lower surface pressure gauges is adjusted.

Herein, the pressure indicated on upper surface pressure gauges 303a to 303f is adjusted by the opening degree of the upper surface pressure regulating valves 304a to 304f so that the pressure may be high in the central nozzle pipe, that is, 1.2 kg/cm$^2$ in 303a, 1.6 kg/cm$^2$ in 303b, 2.0 kg/cm$^2$ in 303c, 2.0 kg/cm$^2$ in 303d, 1.6 kg/cm$^2$ in 303e, and 1.2 kg/cm$^2$ in 303f.

Similarly, the pressure indicated on lower surface pressure gauges is adjusted to appropriate values by the opening degree of the lower surface pressure regulating valves depending on the number of feed rollers and the configuration.

By etching according to such setting of oscillating angle and oscillating speed of nozzle pipes and spray pressure, as compared with the conventional etching apparatus and etching method, in which the conductor pattern width after etching fluctuates about 50 to 100 μm from the setting value in the upper and lower surfaces and in the central area and peripheral area of the printed wiring board, it is proved that the fluctuations are extremely decreased to about 10 to 20 μm in the etching apparatus and etching method of the invention.

Referring next to FIG. 6, the manufacturing method of printed wiring board is explained in the etching apparatus of printed wiring board having at least two etching booths, that is, first etching booth 307a and second etching booth 307b.

The oscillating angle of the central nozzle pipes 302c and 302d is set smaller than the oscillating angle of both side nozzle pipes 302a and 302b, and 302e and 302f, by moving the positions of the fulcrum on the rotating disk of the oscillating mechanism of link mechanism, and the rotating speed of the control motor is increased by using the inverter circuit or current or voltage control circuit, and the oscillating speed is increased.

In the plural nozzle pipes of the second etching booth, the oscillating angle of the central nozzle pipes is set smaller than the oscillating angle of the both side nozzle pipes, and the oscillating speed is set larger, and also the oscillating angle is set larger than that of the corresponding nozzle pipes of the first etching booth, and the oscillating speed is set smaller. For this purpose, another oscillating mechanism is needed for plural nozzle pipes of the second etching booth, but its illustration is omitted.

In the first etching booth, by etching the central area of the printed wiring board at an angle close to vertical direction by heightening the injection pressure of the etchant and decreasing the oscillating angle, the side etching amount (etching amount in the lateral direction) is decreased, and the oscillating speed is increased, so that stagnant etchant in the central area may be avoided.

In the second etching booth, occurrence of side foot of etching circuit is prevented over a wide range, and stagnant etchant in the central area is eliminated, so that a printed wiring board of higher precision can be manufactured.

By etching in the conditions of oscillating angle and oscillating speed of nozzle pipes in the first etching booth and second etching booth, as compared with the conventional etching apparatus and etching method, in which the conductor pattern width after etching fluctuates about 50 to 100 μm from the setting value in the upper and lower surfaces and in the central area and peripheral area of the printed wiring board, the fluctuations are extremely decreased to about 10 to 20 μm in the etching apparatus and etching method of the invention.

In FIG. 6, as in the embodiment in FIG. 5, the etching apparatus may comprise pressure gauges and pressure regulating valves for nozzle pipes, and in addition to setting of oscillating angle and oscillating speed of nozzle pipes in the first etching booth and second etching booth, by adjusting the pressure of each nozzle pipe, etching conditions of higher precision can be set.

In the embodiment of the invention, the printed wiring board 308 is a two-sided printed wiring board without through hole plating, but it may be also applied in a one-sided printed wiring board, a two-sided printed wiring board with through hole plating, or a multilayer printed wiring board, and the etching resist is an organic material formed by screen printing method or photographic method, but solder or other metal resist or photosensitive electrodeposition resist may be used. The etchant is cupric chloride, but ferric chloride, ammonia or other alkaline etchant may be also used.

The copper lined laminate board is prepared by cutting to a specified size and forming 35 μm thick copper foils on both sides of an insulating substrate, but it is evident from the configuration of the invention that it is easily applied in various board sizes or different etching precisions or conductor thicknesses by adjusting the set pressure.

Further, in the embodiment of the invention, among the manufacturing apparatuses of printed wiring boards, the etching apparatus for etching of copper foil is explained, but the invention may be similarly applied also in the developing apparatus for developing and removing unexposed portion of photosensitive resist.

(Embodiment 4)

Figure 8:
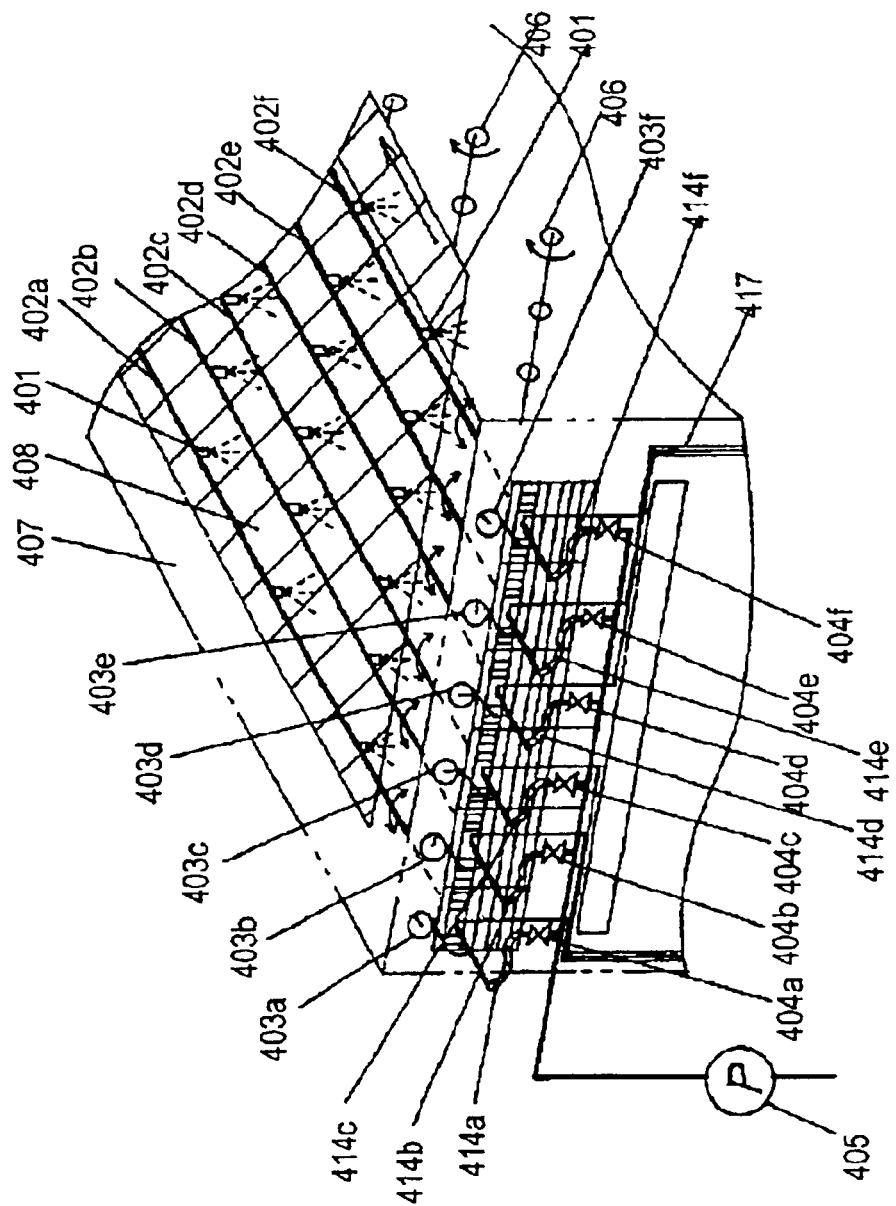
FIG. 8 is an outline diagram of an etching apparatus of printed wiring board in embodiment 4 of the invention.
Figure 9:
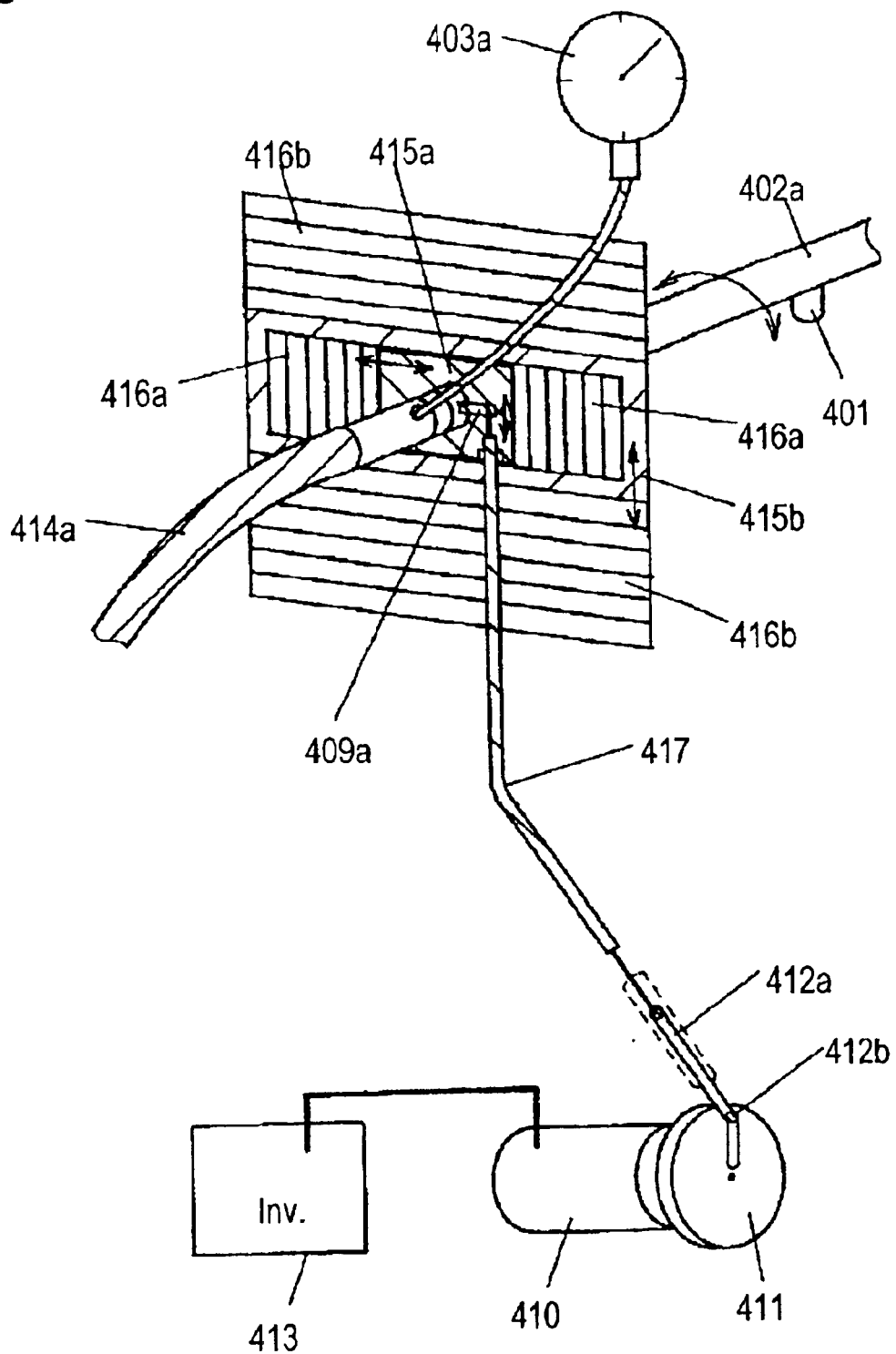
FIG. 9 is a detailed diagram of an independent nozzle pipe of the etching apparatus of printed wiring board in embodiment 4 of the invention.
Figure 10:
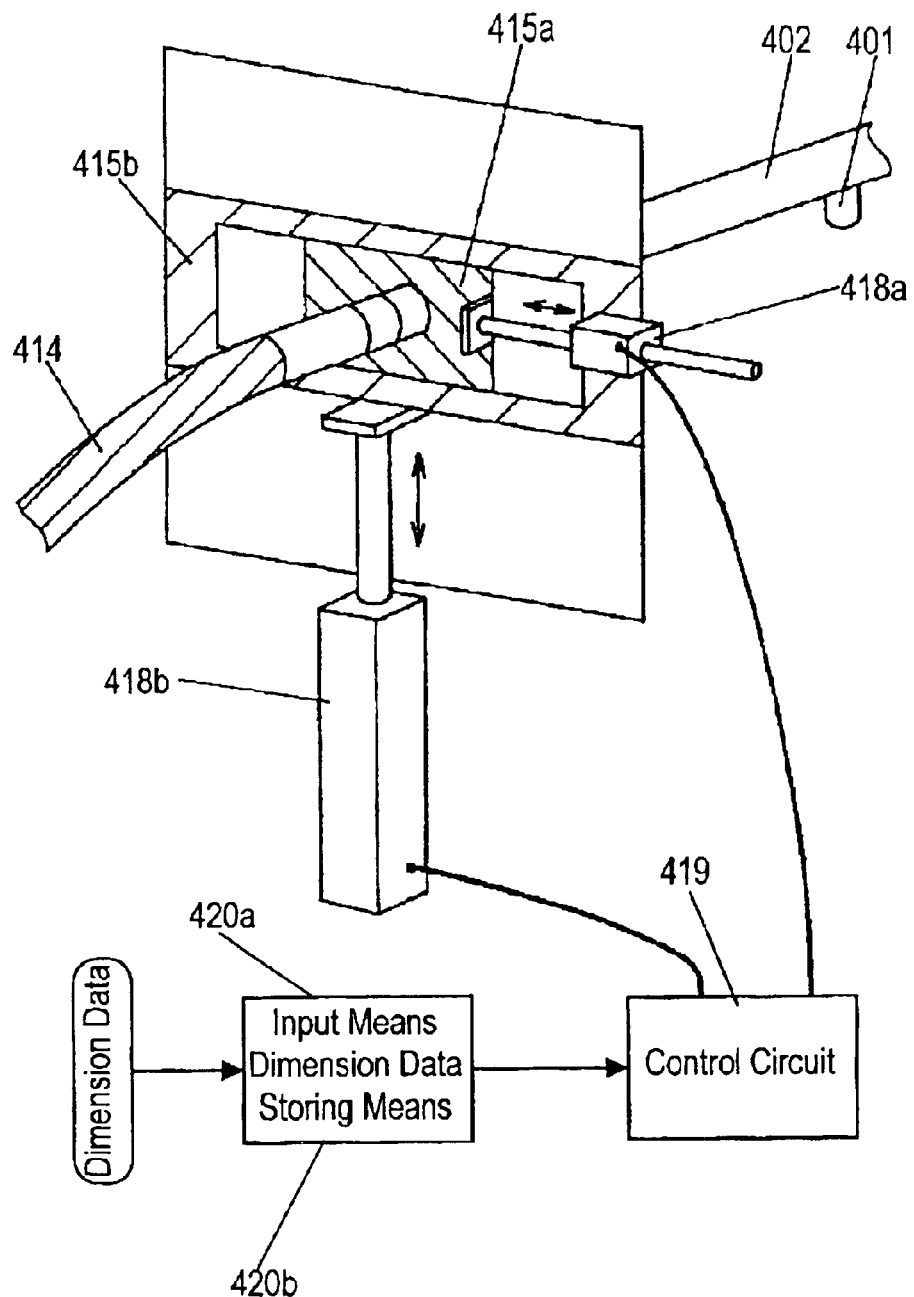
FIG. 10 is a detailed diagram of the independent nozzle pipe of the etching apparatus of printed wiring board in embodiment 4 of the invention.
Figure 11:
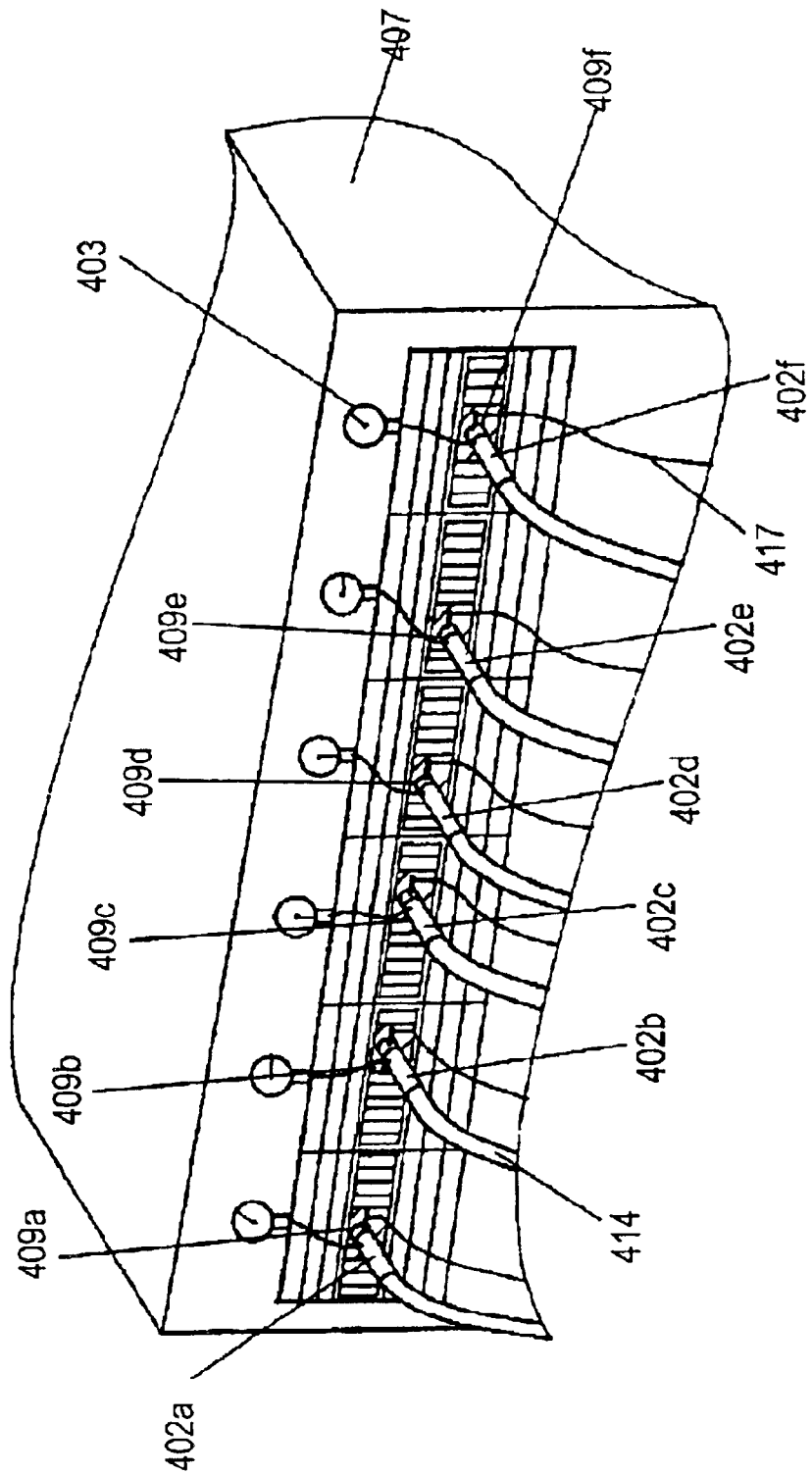
FIG. 11 is a diagram showing the condition setting of the etching apparatus of printed wiring board in embodiment 4 of the invention.
Figure 12:
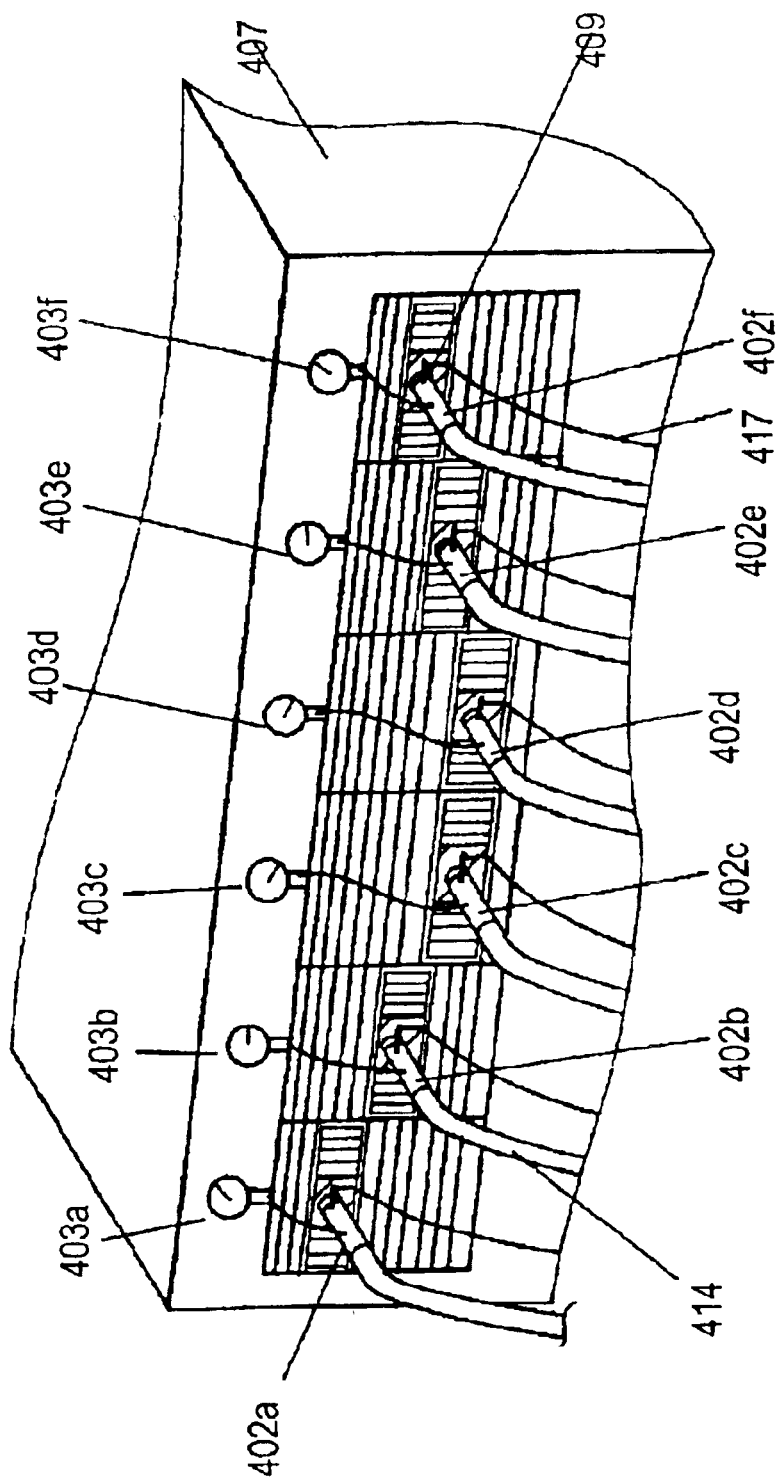
FIG. 12 is a diagram showing the condition setting of the etching apparatus of printed wiring board in embodiment 4 of the invention.

Embodiment 4 of the invention is described by referring to the accompanying drawings. FIG. 8 is an outline diagram of an etching apparatus as a manufacturing apparatus of printed wiring board in embodiment 4 of the invention, FIG. 9 and FIG. 10 are detailed diagrams of an independent nozzle pipe of the manufacturing apparatus of printed wiring board in embodiment 4 of the invention, and FIG. 11 and FIG. 12 are diagrams showing the condition setting of the manufacturing apparatus of printed wiring board in embodiment 4 of the invention.

An etching apparatus is explained as the manufacturing apparatus of printed wiring board in this embodiment.

The configuration of the etching apparatus of the embodiment is similar to a conventional apparatus for etching from both upper surface and lower surface simultaneously, and the upper structure and lower structure are basically the same. For the ease of explanation of the invention, therefore, only the upper structure is explained by referring to the drawings.

As shown in FIG. 8, upper surface nozzle pipes 402a to 402f are disposed parallel to or at an angle of 1 to 5° to the running direction of a printed wiring board 408 in an etching booth 407. The plural upper surface nozzle pipes 402a to 402f are provided with a plurality of spray nozzles 401. Each upper surface nozzle pipe is connected to an upper surface spray pump 405 for supplying an etchant as treating solution through pressure-proof flexible tubes 414a to 414f. In the individual passages of nozzle pipes, pressure-proof flexible tubes 414a to 414f, and upper spray pump 405, upper surface pressure regulating valves 404a to 404f as means for regulating the spray pressure are provided together with the upper surface pressure gauges 403a to 403f provided at the downstream side. The printed wiring board 408 is conveyed at a specified speed in the running direction indicated by arrow by a feed roller 406.

As shown in FIG. 9, a nozzle pipe, for example, 402a penetrates through a first support member 415a, and is supported by an oscillating mechanism 409a so as to be oscillated. The first support member 415a is supported by a second support member 415b so as to be movable in the lateral direction in the second support member 415b. The second support member 415b is supported to be movable vertically in the moving region of front wall and rear wall (not shown) of the etching booth 407.

In the moving regions of the first support member 415a and second support member 415b, as shown in FIG. 9, a first bellows member 416a is disposed in the moving region in the lateral direction of the first support member 415a, and a second bellows member 416b is disposed in the moving region in the vertical direction of the second support member 415b. In this configuration, if the upper surface nozzle pipes 402a to 402f move laterally or vertically, owing to the presence of the pressure-proof flexible tubes 414a to 414f, the piping is not cracked or broken, and owing to the presence of the bellows members, the etchant and etching gas in the etching booth 407 will not escape outside, and the mutual interval of the specified upper surface nozzle pipes 402a to 402f and the distance from the printed wiring board 408 may be set closer or more remote.

As a method of moving automatically the nozzle pipes, as shown in FIG. 10, linear motion is employed as the means for moving the first support member 415a and second support member 415b. In this embodiment, the first support member 415a is moved by a motor driven cylinder 418a as linear motion, and the second support member 415b is moved by a motor driven cylinder 418b also as linear motion. In particular, the mounting position of the motor driven cylinder 418a must be considered so as not to contact with adjacent nozzle pipes.

The motor driven cylinders 418a, 418b control the moving position by a control circuit 419, and the control circuit 419 is operated by a signal from input means 420a. In this configuration, each nozzle pipe can be moved automatically.

The input means 420a may be replaced by dimensional data storing means 420b as means for entering and converting dimensional data of printed wiring board, and dimensional data may be entered therein.

As a result, depending on the board size of the printed wiring board, the interval of nozzle pipes may be set automatically.

As its method, the dimension of the printed wiring board in the lateral direction to the running direction is measured preliminarily, and is fed into the dimensional data storing means 420b, and after moving and setting the intervals of the nozzle pipes corresponding to the dimensional data, etching is performed. That is, as compared with the case of etching the printed wiring board having the lateral direction dimension of 600 mm, in the case of etching of the printed wiring board having a dimension of 400 mm, the interval of nozzle pipes is set narrower.

Hence, the printed wiring board can be manufactured in the condition of the highest etching efficiency depending on the dimension of the printed wiring board.

The upper surface nozzle pipes 402a to 402f are equipped with independent oscillating mechanisms.

Independent oscillating mechanism 409a to 409f shown in FIG. 11 corresponding to the upper surface nozzle pipes 402a to 402f are individually composed of a cam 411 and a link mechanism 412a as shown in FIG. 9, and the oscillating angle can be varied by moving the positions of the fulcrum 412b on the rotating disk of the link mechanism. The cam (rotating disk) 411 is directly coupled to a control motor 410, or is interlocked by belt or gear, and the control motor 410 is easily changed in the rotating speed by means of an inverter circuit 413.

When changing only the oscillating angle in each nozzle pipe and keeping the oscillating speed the same, only one control motor 410 is used, and the equipment cost can be saved.

Further, the independent nozzle pipes are supported by the first support member 415a as shown in FIG. 9, and partly fixed on the same first support member 415a in an oscillatable state, and coupled with a flexible wire 417 interlocked with the fulctrum 412b of the rotating disk of the link mechanism, so as to oscillate by the forward and backward motion of the wire. The moving distance of the flexible wire 417 is varied by moving the position of the fulcrum 412b of the link mechanism, so that the oscillating angle can be changed. The wire moving speed is changed by the number of revolutions of the cam (rotating disk) 411. In this structure, if the nozzle pipes move laterally and vertically, it is possible to keep independence of the oscillating angle and oscillating speed in the oscillating mechanism of each nozzle pipe.

The etching method of printed wiring board in the etching apparatus having such configuration is explained below.

Prior to etching of the printed wiring board by conveying into the etching apparatus after the exposure and development steps of the photosensitive etching resist in the copper lined laminate board, setting of the etching conditions in the etching apparatus of the invention is explained.

Basic etching conditions are usually set on the upper and lower surfaces, but in this embodiment, however, only setting of etching conditions on the upper surface is mainly explained.

The reason is that the etching precision usually fluctuates largely on the upper surface as explained in the mechanism of the prior art. On the lower surface, by contrast, the etchant is not collected in the central area of the printed wiring board as seen on the upper surface, but only a slight fluctuation may be caused due to blocking of contact of the injected etchant with the printed wiring board owing to the presence of the roller for conveying the printed wiring board. This is discussed later, and in the specific example described below, condition setting on the upper surface of the printed wiring board of the etching apparatus is explained in the following two cases: (1) setting of mutual interval of nozzle pipes, oscillating angle, oscillating speed, and pressure of etchant, and (2) setting of distance of nozzle pipe from board conveying surface, oscillating angle, oscillating speed, and pressure of etchant.

(1) Setting of mutual interval of nozzle pipes, oscillating angle, oscillating speed, and pressure of etchant is explained.

As the first setting, the interval of nozzle pipes is explained.

As shown in FIG. 11, the interval of the central nozzle pipes 402c and 402d is about 30 to 50% narrower than the interval of other nozzle pipes 402a and 402b, and 402e and 402f, and as required, the interval of the nozzle pipes closer to the center 402b and 402c, and 402d and 402e may be set about 10 to 30% narrower.

By this structure of disposing the nozzle pipes at narrower intervals in the central positions, the amount of the etchant blown to the central area on the printed wiring board can be increased.

As the second setting, the oscillating angle and oscillating speed of nozzle pipes are explained.

In the structure shown in FIG. 9, the oscillating angle of the central nozzle pipes 402c and 402d is set larger than the oscillating angle of other nozzle pipes 402a and 402b, and 402e and 402f, by moving the position of the link fulcrum of the cam in the oscillating mechanism, so that the displacement of the forward and backward moving distance of the cooperating flexible wire 417 is increased.

Further, the oscillating speed of the central nozzle pipes 402c and 402d is set larger than that of other nozzle pipes 402a and 402b, and 402e and 402f, by means of an inverter circuit 413 and current or voltage control circuit not shown.

Further, on the basis of the above setting of the etching apparatus, the spray pressure of each nozzle pipe is set as follows as the third setting.

As the pressure setting of the etching apparatus, the pressure indicated on upper surface pressure gauges 403a to 403f is adjusted by the opening degree of the upper surface pressure regulating valves 404a to 404f so that the pressure may be high in the central nozzle pipes, that is, 1.2 kg/cm$^2$ in the gauge 403a, 1.6 kg/cm$^2$ in the gauge 403b, 2.0 kg/cm$^2$ in the gauge 403c, 2.0 kg/cm$^2$ in the gauge 403d, 1.6 kg/cm$^2$ in the gauge 403e, and 1.2 kg/cm$^2$ in the gauge 403f.

This printed wiring board 408 is conveyed into the etching booths 407 between the upper surface nozzle pipes 402a to 402f and lower surface nozzle pipes not shown disposed parallel to or at a certain angle to the running direction, at a specified speed on the feed roller 406, and is etched by blowing an etchant such as cupric chloride on both upper and lower surfaces from spray nozzles 401. At the time of etching, the upper surface nozzle pipes 402a to 402f and lower surface nozzle pipes are oscillated at independent oscillating angles and oscillating speeds individually, within a plane at right angle to the running direction of the printed wiring board, by setting the oscillating angle at 45° for the central nozzle pipes 402c and 402d, and 60° for the other nozzle pipes 402a and 402b, and 402e and 402f, and the etchant supplied from the upper surface spray pump 405 to the upper surface nozzle pipes 402a to 402f is regulated by the opening degree of the upper surface pressure regulating valves 404a to 404f, and the spray pressure indicated on upper surface pressure gauges 403a to 403f is adjusted.

By etching on the basis of setting of oscillating angle and oscillating speed of nozzle pipes and pressure of the spray, as compared with the conventional etching apparatus and etching method, in which the conductor pattern width after etching fluctuates about 50 to 100 μm from the setting value in the upper and lower surfaces and in the central area and peripheral area of the printed wiring board, the fluctuations are extremely decreased to about 10 to 20 μm in the etching apparatus and etching method of the invention.

(2) Setting of the distance of the nozzle pipe from board conveying surface, oscillating angle, oscillating speed, and pressure of etchant is explained. In place of the change of mutual interval of nozzle pipes as the first setting in case (1), in this condition setting, the distance between each nozzle pipe and board conveying surface is explained in the case of moving the central nozzle pipes in the vertical direction.

As shown in FIG. 12, the distance of the central nozzle pipes 402c and 402d from the board conveying surface is about 30 to 50% shorter than the distance of other nozzle pipes 402a and 402b, and 402e and 402f from the board conveying surface, and as required, the distance of the nozzle pipes closer to the center 402*b* and 402*e* from the board conveying surface may be set about 10 to 30% shorter. By this structure of disposing the nozzle pipes closer to the board conveying surface in the central positions, the amount of the etchant blown to the central area on the printed wiring board can be increased.

Further, on the basis of the above setting of the etching apparatus, the spray pressure of each nozzle pipe is set as follows as the third setting.

The pressure indicated on upper surface pressure gauges 403*a* to 403*f* is adjusted by the opening degree of the upper surface pressure regulating valves 404*a* to 404*f* so that the pressure may be high in the central nozzle pipes, that is, 1.2 kg/cm$^2$ in 403*a*, 1.6 kg/cm$^2$ in 403*b*, 2.0 kg/cm$^2$ in 403*c*, 2.0 kg/cm$^2$ in 403*d*, 1.6 kg/cm$^2$ in 403*e*, and 1.2 kg/cm$^2$ in 403*f*.

As in case (1), in this condition, the pressure of the two central nozzle pipes is set higher than the pressure of the other nozzle pipes, but what differs from case (1) is that since the distance from the printed wiring board is shorter, the pressure in the central area can be set lower as a comparative value, and further the pressure of other nozzle pipes may be set higher, and the etching speed can be increased on the whole, so that the productivity may be higher than in case (1).

Moreover, the pressure setting range of each nozzle pipe may be wider by bringing the central nozzle pipes further closer to the board conveying surface, bringing the central both side nozzle pipes closer than nozzle pipes at outer most ends, or adjusting the oscillating angle and oscillating speed of the nozzle pipes.

This printed wiring board 408 is conveyed into the etching booths 407 between the upper surface nozzle pipes 402*a* to 402*f* and lower surface nozzle pipes disposed parallel to or at a certain angle to the running direction, at a specified speed on the feed roller 406, and is etched by blowing an etchant such as cupric chloride on both upper and lower surfaces from spray nozzles 401.

At the time of etching, the upper surface nozzle pipes 402*a* to 402*f* and lower surface nozzle pipes are oscillated at independent oscillating angles and oscillating speeds individually, within a plane at right angle to the running direction of the printed wiring board, by setting the oscillating angle at 45° for the central nozzle pipes 402*c* and 402*d*, and 60° for the other nozzle pipes 402*a* and 402*b*, and 402*e* and 402*f*, and the etchant supplied from the upper surface spray pump 405 to the upper surface nozzle pipes 402*a* to 402*f* is regulated by the opening degree of the upper surface pressure regulating valves 404*a* to 404*f*, and the spray pressure indicated on upper surface pressure gauges 403*a* to 403*f* is adjusted.

By etching on the basis of setting of oscillating angle and oscillating speed of nozzle pipes and pressure of the spray, as compared with the conventional etching apparatus and etching method, in which the conductor pattern width after etching fluctuates about 50 to 100 $\mu$m from the setting value in the upper and lower surfaces and in the central area and peripheral area of the printed wiring board, the fluctuations are extremely decreased to about 10 to 20 $\mu$m in the etching apparatus and etching method of the invention.

Merits of combining the cases (1) and (2) are explained below.

As one of the effects, since the injection pressure to the plural spray nozzles 401 attached to the nozzle pipes is not set extremely low, probability of foreign matter clogging troubles of the etchant injection port of spray nozzles 401 is lowered. Moreover, since the pressure at both sides is not too low, by closing the pressure regulating valve and narrowing the passage of the etchant, fluid loss can be lowered and the energy efficiency is enhanced.

To etch the entire printed wiring board at a uniform speed, by setting the interval of nozzle pipes, distance from the board conveying surface, and oscillating angle and oscillating speed of the nozzle pipes appropriately, stagnant liquid in the central part in the conventional printed wiring board can be eliminated. As a result, the pressure setting range of nozzle pipes may be wider.

Hence, depending on various board sizes or required precision of the conductor circuit, the pressure setting of the nozzle pipes can be adjusted finely, and the condition can be set easily by the pressure regulating valve while observing the indication of pressure gauge of each nozzle pipe.

In this embodiment, the condition setting is mainly explained about the upper surface of the printed wiring board.

Condition setting of the lower surface of the printed wiring board generally differs in each etching apparatus, depending on the number of feed rollers, roller pitch, and mounting position.

The etching conditions of the lower surface of the printed wiring board in each etching apparatus are set by adjusting the mutual interval of nozzle pipes, distance from the board conveying surface, and oscillating angle and oscillating speed of the nozzle pipes. After setting roughly uniform etching conditions on the entire surface of the printed wiring board, as in the case of the upper surface of the printed wiring board, fine adjustment is achieved by regulating the pressure of each nozzle pipe again.

It is therefore possible to be applicable to the feed roller, roller pitch and number of rollers different in each etching apparatus.

As a result, it is not necessary to consider the pitch of the feed rollers, change the position, or adjust the number of rollers conventionally required to make uniform the etching precision of the lower surface on the entire surface of the printed wiring board, and the conditions can be set easily by setting the parameters of the etching apparatus and finely adjusting the pressure.

In the embodiment of the invention, the condition setting of the etching apparatus is explained in two cases: (1) setting of mutual interval of nozzle pipes, oscillating angle, oscillating speed, and pressure of etchant, and (2) setting of distance of nozzle pipe from board conveying surface, oscillating angle, oscillating speed, and pressure of etchant. But the etching conditions may be set in other combinations, for example, (3) setting of interval of nozzle pipes, distance from board conveying surface, and pressure, and (4) setting of interval of nozzle pipes, distance from board conveying surface, oscillating angle and oscillating speed. Further, the conditions may be set by including all cases, that is, (5) setting of interval of nozzle pipes, distance from board conveying surface, oscillating angle, oscillating speed, and pressure.

Further, in the embodiment of the invention, among the manufacturing apparatuses of printed wiring boards, the etching apparatus for etching of copper foil is explained, but the invention may be similarly applied also in the developing apparatus for developing and removing unexposed portions of photosensitive resist.

(Embodiment 5)

Embodiment 5 of the invention is described by referring to the accompanying drawings.

Figure 13:
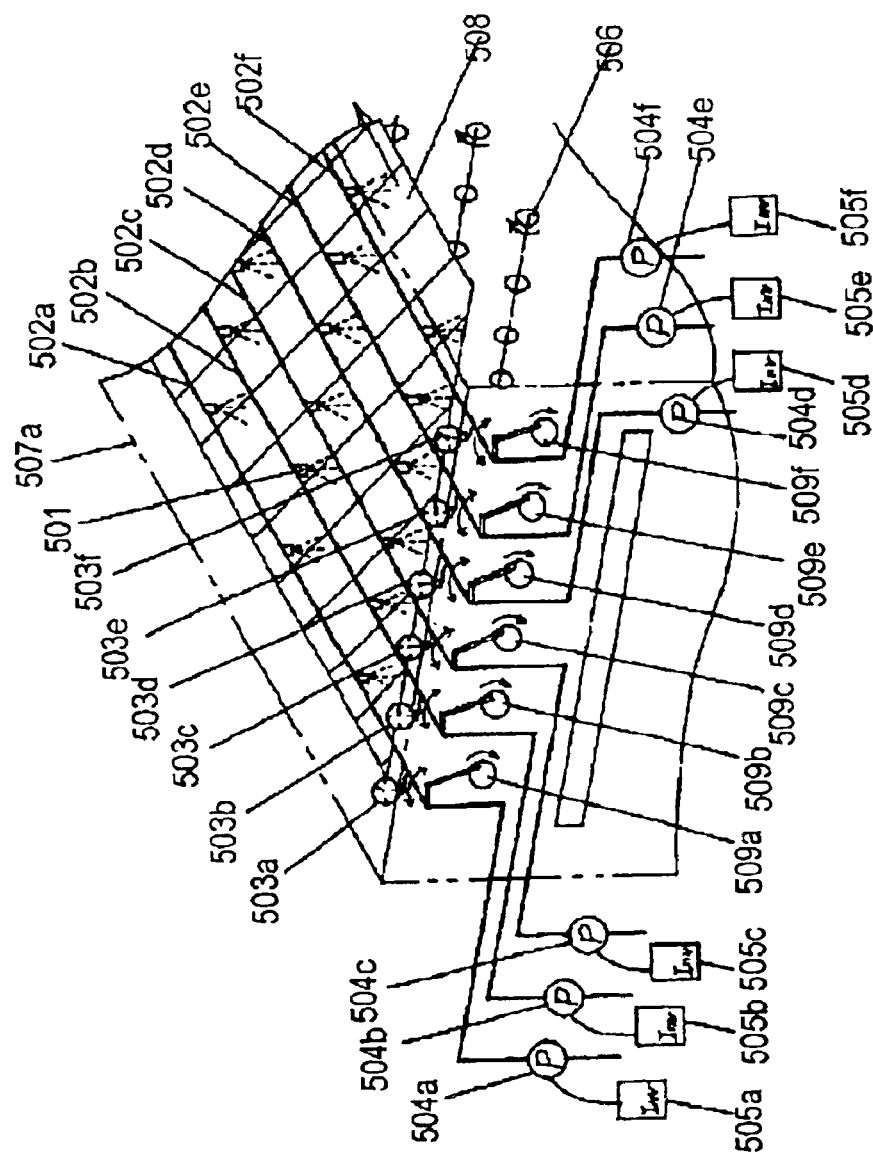
FIG. 13 is an outline diagram of a manufacturing apparatus of printed wiring board in embodiment 5 of the invention.
Figure 14:
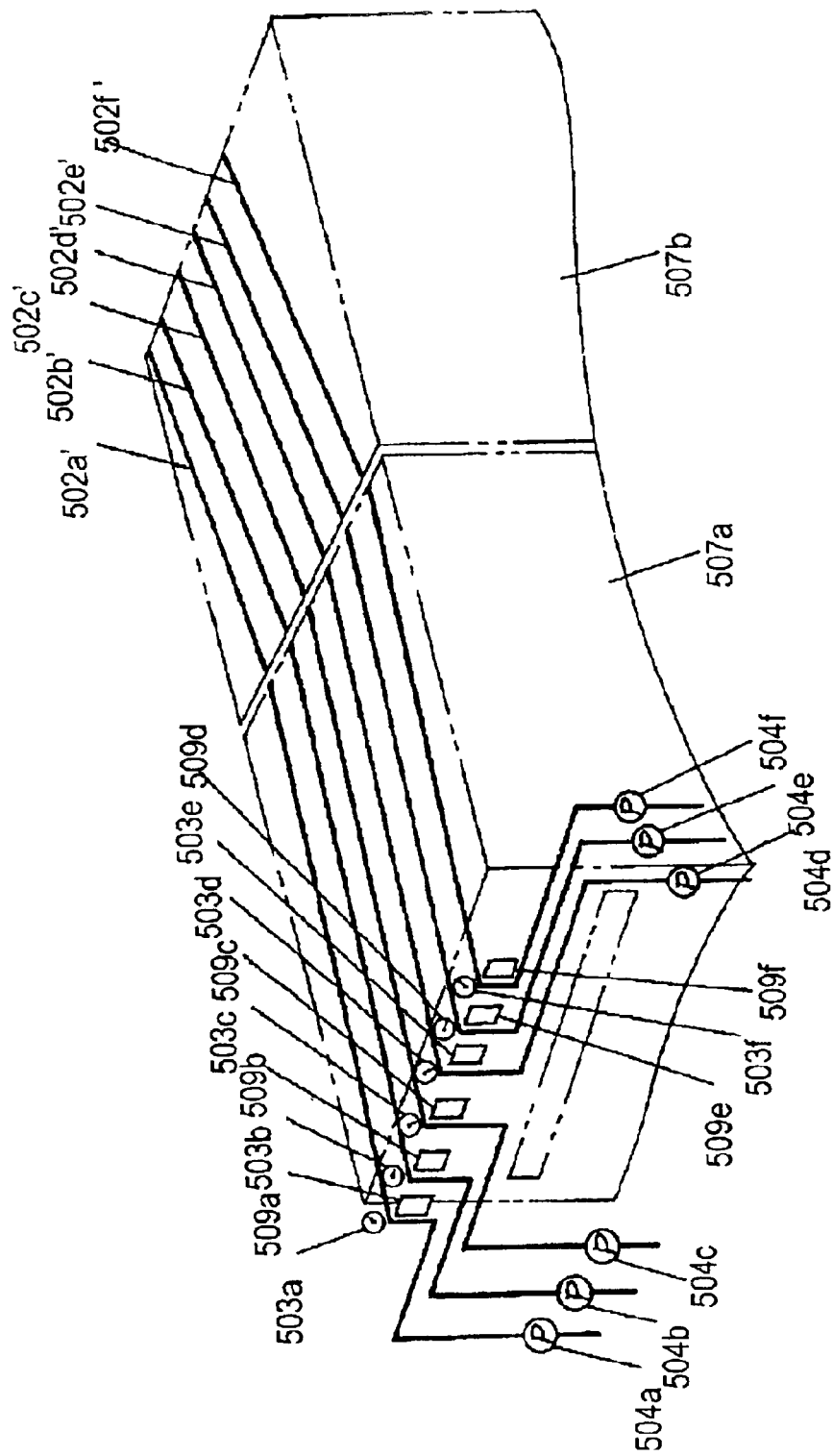
FIG. 14 is an outline diagram of the manufacturing apparatus of printed wiring board in embodiment 5 of the invention.
Figure 15:
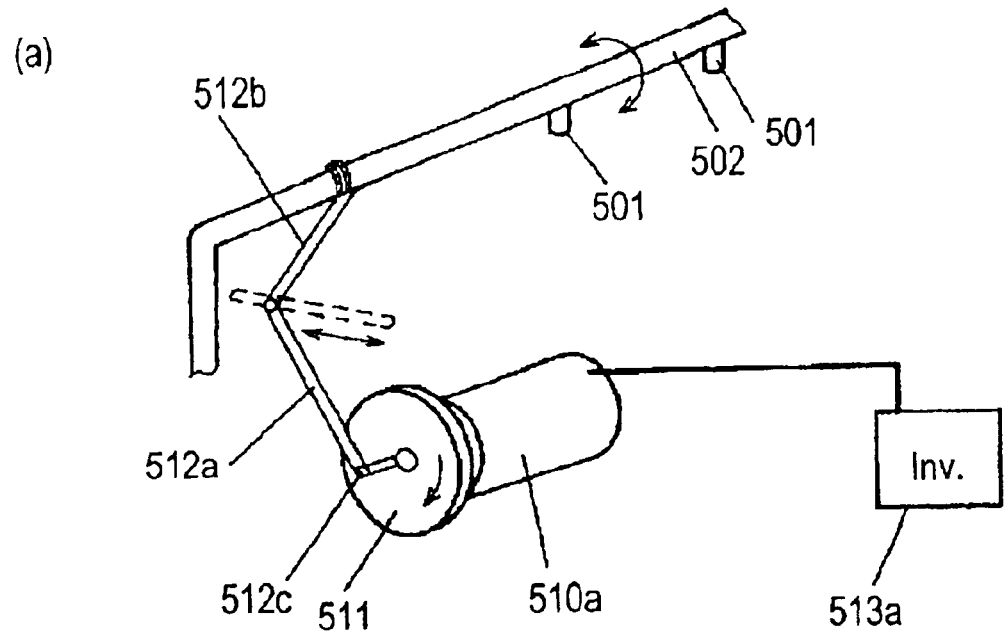
FIG. 15 is a detailed diagram of an oscillating mechanism of nozzle pipes of the manufacturing apparatus in embodiment 5 of the invention.
Figure 15:
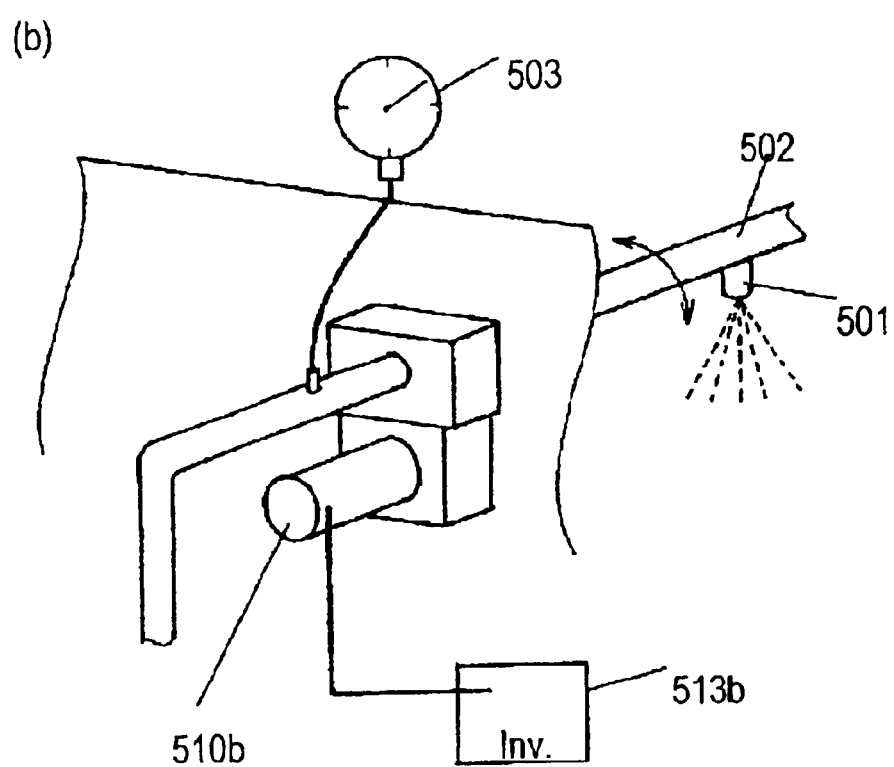

FIG. 13 and FIG. 14 are outline diagrams of an etching apparatus as a manufacturing apparatus of printed wiring board in embodiment 5 of the invention, and FIG. 15(a) and FIG. 15(b) are detailed diagrams of an oscillating mechanism of nozzle pipes of the etching apparatus as the manufacturing apparatus in embodiment 5 of the invention.

The etching apparatus of printed wiring board in embodiment 5 of the invention is explained.

The configuration of the etching apparatus in the embodiment of the invention is similar to a conventional apparatus for etching from both upper surface and lower surface simultaneously, and the upper structure and lower structure are basically the same. For the ease of explanation of the invention, therefore, only the upper structure is explained by referring to the drawings.

As shown in FIG. 13, upper surface nozzle pipes 502a to 502f are disposed parallel to or at an angle of 1 to 5° to the running direction of a printed wiring board to be conveyed by a feed roller 506 into a first etching booth 507a. The nozzle pipes have a plurality of spray nozzles each, and are provided with independent oscillating mechanisms 509a to 509f. Plural upper surface spray pumps 504a to 504f controlled by corresponding inverter circuits 505a to 505f supply an etchant as treating solution to the corresponding nozzle pipes 502a to 502f. The nozzle pipes are provided with corresponding upper surface pressure gauges 503a to 503f.

FIG. 14 shows two etching booths, that is, a first etching booth 507a as a first treating booth, and a second etching booth 507b as a second treating booth, in which upper surface nozzle pipes 502a to 502f are disposed at an angle of 1 to 5° to the running direction of the printed wiring board 508 in the first etching booth 507a, and upper surface nozzle pipes 502a' to 502f are disposed at an angle (reverse angle) of 1 to 50 in the reverse direction of the nozzle pipes in the first etching booth in the second etching booth 507b.

FIG. 15(a) shows the detail of an independent oscillating mechanism of a nozzle pipe in the embodiment.

An independent oscillating mechanism corresponding to each nozzle pipe comprises a cam (rotating disk) 511 and link mechanisms 512a, 512b, and the oscillating angle can be varied by moving the position of the fulcrum 512c of the link mechanism on the rotating disk 511. The cam 511 is directly coupled to a control motor 510a, or is interlocked by belt or gear, and the control motor 510a is easily changed in the rotating speed by means of an inverter circuit 513a.

In this configuration, in each nozzle pipe, the oscillating angle and oscillating speed can be varied independently.

When changing only the oscillating angle in each nozzle pipe and keeping the oscillating speed the same, only one control motor 510a is used, and the equipment cost can be saved.

FIG. 15(b) shows another example of an independent oscillating mechanism of a nozzle pipe.

An independent oscillating mechanism corresponding to each nozzle pipe is coupled to a stepping motor 510b directly or by means of a gear, and the stepping motor 510b can easily change the oscillating angle and oscillating speed electrically by means of a control and drive circuit 513b.

In the etching apparatus having such configuration, the etching method of printed wiring board is explained below.

As the conditions in the etching apparatus only in the first etching booth 507a of printed wiring board in FIG. 13 of the embodiment, the oscillating angle of the central nozzle pipes 502c and 502d is set smaller than the oscillating angle of the other nozzle pipes 502a and 502b and 502e and 502f, by moving the position of the link fulcrum 512c on the cam 511 of the link mechanism in the oscillating mechanism, and further the oscillating speed of the central nozzle pipes 502c and 502d is set larger than that of the other nozzle pipes 502a and 502b and 502e and 502f, by means of the inverter circuit 513a or current or voltage control circuit.

As a result, by increasing the spraying amount and flow rate of the etchant in the central area on the printed wiring board, the etchant does not stay in the central area of the upper surface, but immediately flows down.

In the apparatus having such configuration, a printed wiring board 508 is prepared by forming an etching resist by screen printing method or photographic method on a copper lined laminate board (not shown) cut in a specified size and having a copper foil of 35 $\mu$m in thickness formed on both sides of an insulating substrate.

This printed wiring board 508 is conveyed into the etching booths 507a, 507b between the upper surface nozzle pipes 502a to 502f and lower surface nozzle pipes disposed parallel to or at a certain angle to the running direction indicated by arrow, at a specified speed on the feed roller 506, and is etched by blowing an etchant such as cupric chloride on both upper and lower surfaces from spray nozzles 501.

At the time of etching, the upper surface nozzle pipes 502a to 502f and lower surface nozzle pipes are oscillated at independent oscillating angles and oscillating speeds individually, within a plane at right angle to the running direction of the printed wiring board, by setting the oscillating angle at 45° for the central nozzle pipes 502c and 502d, and 60° for the other nozzle pipes 502a, 502b, and pipes 502e, 502f, and the etchant supplied from the upper surface spray pumps 504a to 504f to the upper surface nozzle pipes 502a to 502f is regulated by inverter circuits 505a to 505f of the upper surface spray pumps so that the output of the upper surface spray pumps 504a to 504f may indicate the specified spray pressure on the upper surface pressure gauges 503a to 503f.

Similarly, the etchant supplied from the lower surface spray pumps to the lower surface nozzle pipes is regulated by inverter circuits of the lower surface spray pumps so that the output of the lower surface spray pumps may indicate the specified spray pressure on the lower surface pressure gauges.

Herein, the pressure indicated on upper surface pressure gauges 503a to 503f is adjusted by the inverter circuits 505a to 505f so that the pressure may be high in the central nozzle pipe, that is, 1.2 kg/cm² in the gauge 503a, 1.6 kg/cm² in the gauge 503b, 2.0 kg/cm² in the gauge 503c, 2.0 kg/cm² in the gauge 503d, 1.6 kg/cm² in the gauge 503e, and 1.2 kg/cm² in the gauge 503f.

Similarly, the pressure indicated on lower surface pressure gauges is adjusted to appropriate values by the inverter circuits depending on the number of feed rollers 506 and configuration.

By etching according to such setting of oscillating angle and oscillating speed of nozzle pipes and spray pressure, as compared with the conventional etching apparatus and etching method, in which the conductor pattern width after etching fluctuates about 50 to 100 $\mu$m from the setting value in the upper and lower surfaces and in the central area and peripheral area of the printed wiring board, the fluctuations are extremely decreased to about 10 to 20 $\mu$m in the etching apparatus and etching method of the invention.

Referring next to FIG. 14, the manufacturing method of printed wiring board is explained in the etching apparatus of printed wiring board having at least two etching booths, that is, first etching booth 507a and second etching booth 507b.

The oscillating angle of the central nozzle pipes 502c and 502d of the first etching booth 507a is set smaller than the oscillating angle of both side nozzle pipes 502a, 502b, and pipes 502e, 502f, by moving the positions of the fluctrum position on the rotating disk of the rink mechanism of the oscillating mechanism, and the rotating speed of the control motor 510a is increased by using the inverter circuit 513a, and the oscillating speed is increased.

In the plural nozzle pipes of the second etching booth, the oscillating angle of the central nozzle pipes 502c' and 502d' is set smaller than the oscillating angle of the both side nozzle pipes, and the oscillating speed is set larger, and also the oscillating angle is set larger than that of the corresponding nozzle pipes of the first etching booth 507a, and the oscillating speed is set smaller.

In the first etching booth 507a, by etching the central area of the printed wiring board at an angle close to vertical direction by heightening the injection pressure of the etchant, thereby decreasing the side etching amount and accelerating the oscillating speed, stagnant etchant in the central area is eliminated, and occurrence of side foot in the etching circuit is prevented over a wide range in the second etching booth 507b, and stagnant etchant in the central area is avoided, so that a printed wiring board of a higher precision may be manufactured.

At this time, it is preferred to set the pressure indication of the central nozzle pipes 502c and 502d of the first etching booth 507a higher than the pressure indication of the central nozzle pipes. 502c' and 502d' of the second etching booth 507b.

Accordingly, by deep etching of the printed wiring board in the first etching booth 507a, the side etching amount (etching amount in the lateral direction) is decreased, and stagnant etchant in the central area of printed wiring board may be avoided, and occurrence of side foot (lateral spread of conductor circuit) in the conductor circuit being etched in the second etching booth 507b is prevented, and overetching is prevented, and stagnant etchant in the central area of printed wiring board is eliminated, so that a printed wiring board of a higher precision may be manufactured.

By etching in the conditions of oscillating angle and oscillating speed of nozzle pipes in the first etching booth 507a and second etching booth 507b, as compared with the conventional etching apparatus and etching method, in which the conductor pattern width after etching fluctuates about 50 to 100 μm from the setting value in the upper and lower surfaces and in the central area and peripheral area of the printed wiring board, the fluctuations are extremely decreased to about 10 to 20 μm in the etching apparatus and etching method of the invention.

In FIG. 14, as in the embodiment in FIG. 13, the etching apparatus may comprise spray pumps and pressure gauges for nozzle pipes, and in addition to setting of oscillating angle and oscillating speed of nozzle pipes in the first etching booth and second etching booth, by adjusting the pressure of each nozzle pipe, etching conditions of higher precision can be set.

In the embodiment, the oscillating angle and oscillating speed are set by using the oscillating mechanism shown in FIG. 15(a), but it is also possible to set the oscillating angle and oscillating speed automatically by using the oscillating mechanism shown in FIG. 15(b) electrically, and in this case, too, the etching condition of the printed wiring board can be set similarly at high precision.

(Embodiment 6)

Embodiment 6 of the invention is an example for automating setting of etching condition of printed wiring board.

Figure 16:
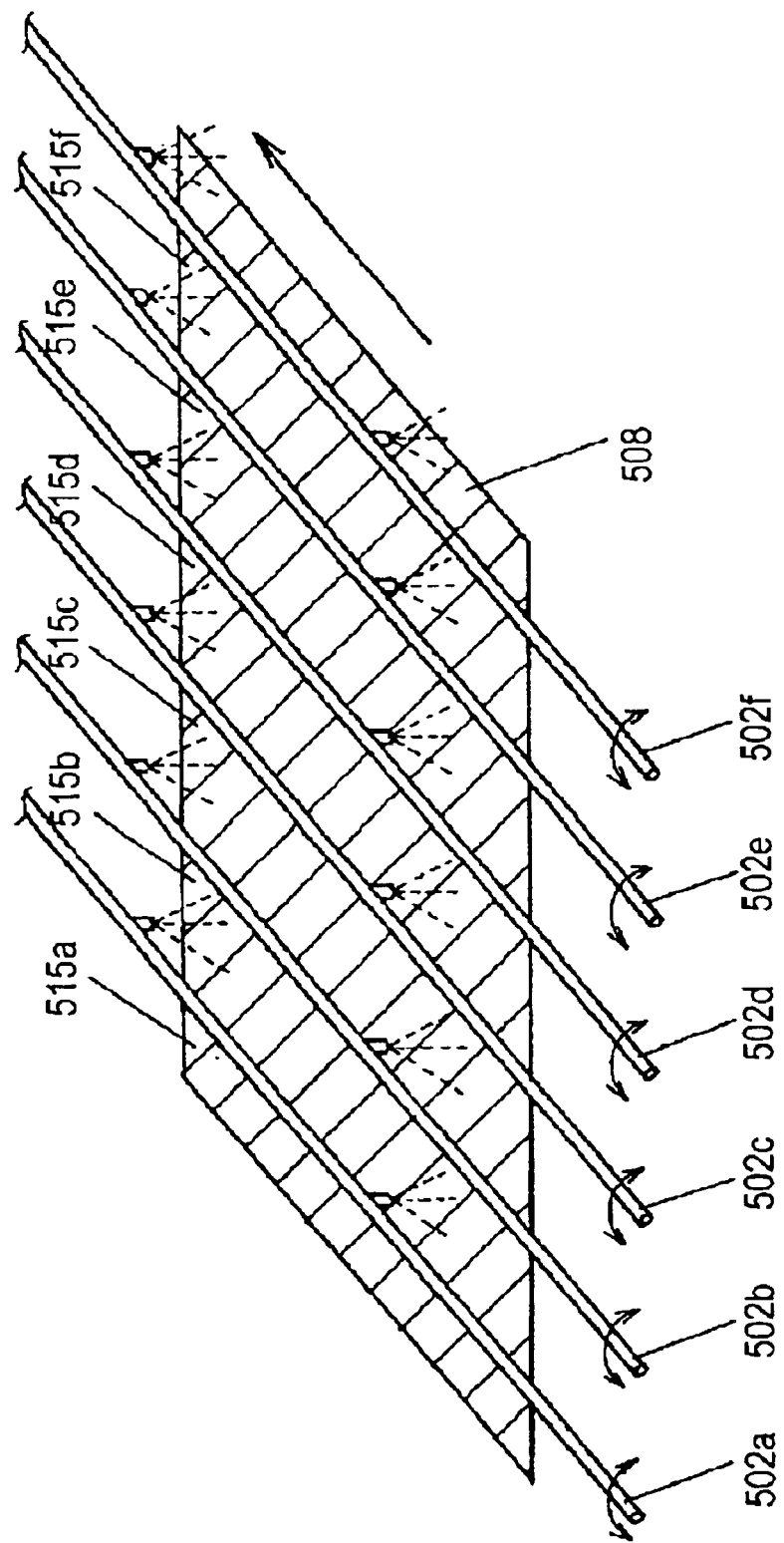
FIG. 16 is a diagram showing a printed wiring board divided in N regions in embodiment 6 of the invention.
Figure 17:
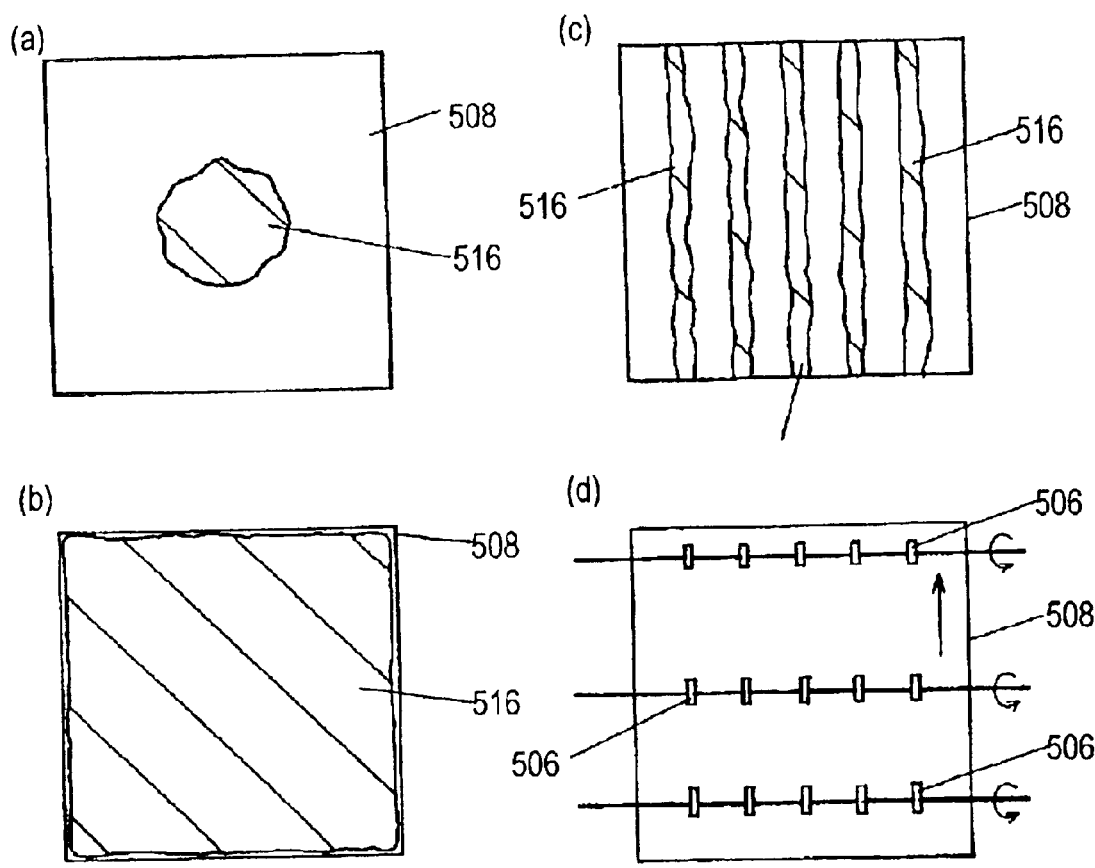
FIG. 17 is a diagram showing the etching state and cause of printed wiring board when setting the etching condition in embodiment 6 of the invention.
Figure 18:
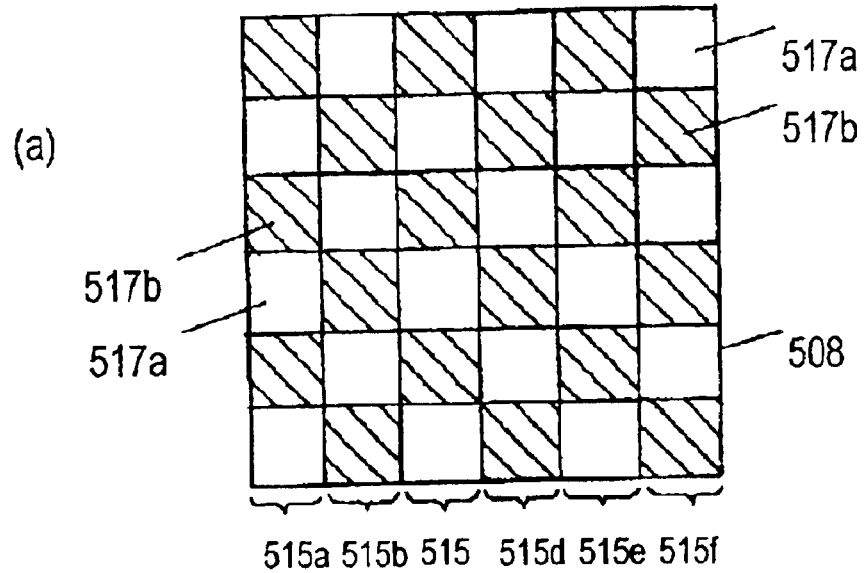
FIG. 18 is a diagram showing a drawing pattern of etching resist.
Figure 18:
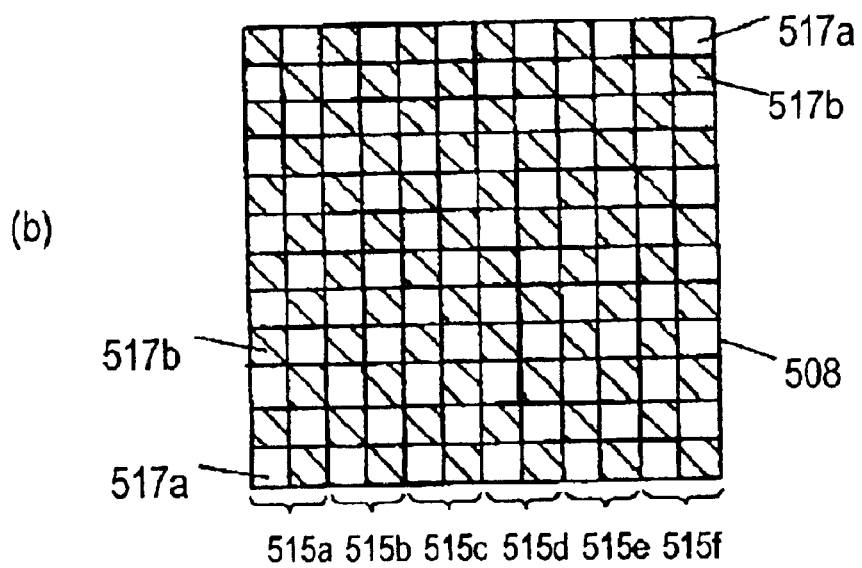
Figure 19:
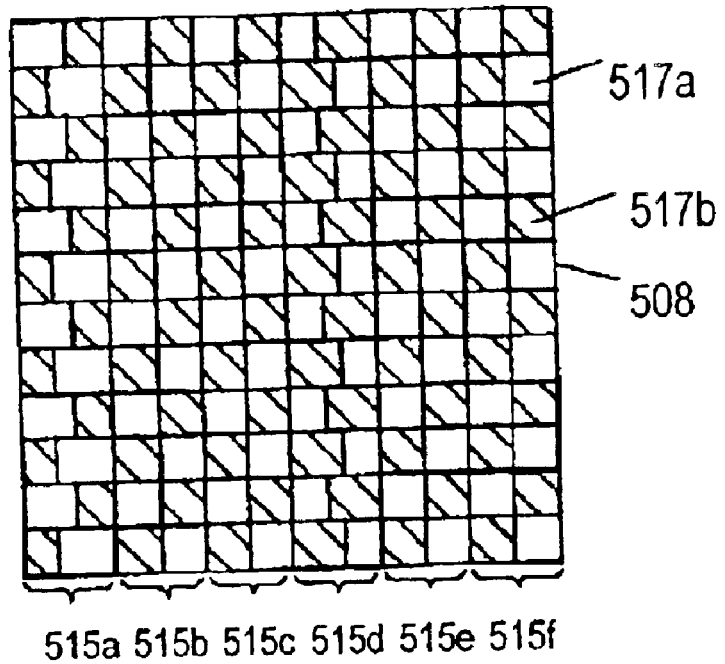
FIG. 19 is a diagram showing a drawing pattern of etching resist.
Figure 19:
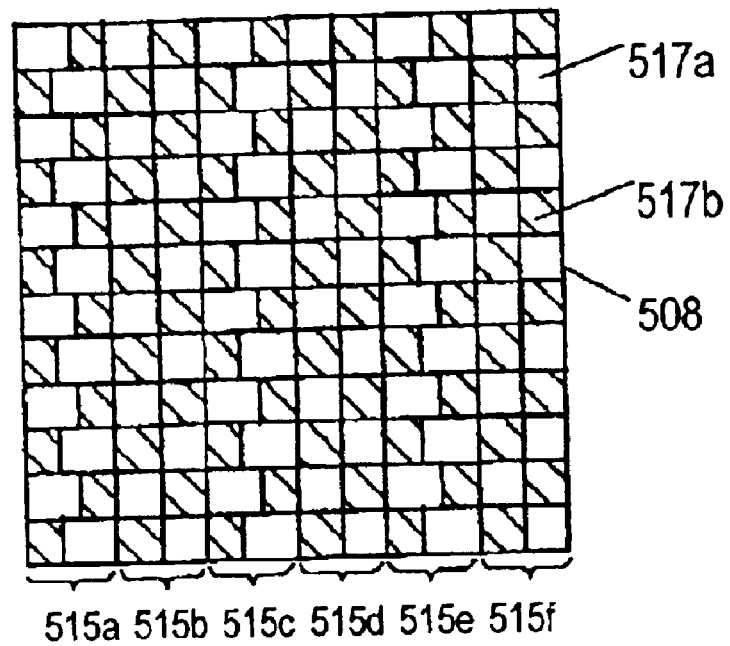

FIG. 16 is a diagram showing a printed wiring board divided in N regions in embodiment 6 of the invention, FIG. 17 is a diagram showing the etching state of printed wiring board when setting the etching condition in embodiment 6 of the invention, and FIG. 18 and FIG. 19 are diagrams showing a drawing pattern of etching resist.

In the explanation of embodiment 6, as in embodiment 5, for the sake of simplicity, mainly the etching condition setting of the upper surface is described by referring to the drawings.

FIG. 16 shows the state of a printed wiring board 508 being conveyed in the running direction of arrow on a feed roller 506 beneath N=6 upper surface nozzle pipes 502a to 502f.

As shown in FIG. 16, the printed wiring board 508 is divided at least into six etching regions in the same number as the nozzle pipes, and they are supposed to be division blocks 515a to 515f.

Showing the etching state in these division blocks 515a to 515f, the setting procedure of etching conditions is explained below.

Generally, the etching apparatus of printed wiring board using photosensitive etching resist is coupled with the developing apparatus in the preceding step and the etching resist stripping apparatus in the succeeding step. Therefore, from the viewpoint of the preceding and succeeding steps, overall length of the line, and intended productivity, the target speed of conveying on the feed roller 506 of the etching apparatus is almost determined at the designing stage of the manufacturing line.

In the explanation of embodiment 6, in the case of thickness of 50 μm of conductor pattern, the conveying speed of the printed wiring board is 3 m/min, and effects of etching force due to specific gravity of the etchant, state of the oxidizing agent, and time course changes are omitted.

(1) Analysis and adjustment of fluctuations of etching force in etching apparatus Generally, the etching apparatus, if assembled by using the same conditions in the same design, may differ in the condition of etching force in each etching apparatus (that is, character of etching apparatus).

A method for analyzing and adjusting is explained.

The printed wiring board to be used may be an electroplated copper foil having a copper layer of 50 μm in thickness, but it is more efficient to use a copper lined laminate board having a copper foil thickness of 35 μm. In this case, the conveyor speed of the etching apparatus is inversely proportional to the conveying speed 3 m/min in the case of thickness of 50 μm, and in the case of copper foil of 35 μm, the basic setting condition of conveying speed is 4.3 m/min.

(1-1) Analysis of Etching State of Upper Surface

The conveying speed is set so that the etching force may be 70 to 80%, or so-called half-etching state, as compared with the case of basic setting condition of the conveying speed. That is, in the case of copper foil of 35 μm, the conveying speed is set at 5.3 m/min to 6.1 m/min.

First, the pressure of the treating solutions of the upper surface nozzle pipes 502a to 502f is set uniformly. In this state, when the printed wiring board having a copper foil of 35 μm is etched at the above conveying speed, the state becomes as shown in FIG. 17(a), and a copper foil remainder 516 is formed in the central area of the printed wiring board. That is, as the character of the etching apparatus on the upper surface, it is known that the fluctuation of etching force differs between the central area and peripheral area of the upper surface of the printed wiring board. Th eliminate this state, the pressure of the upper surface nozzle pipes 502a to 502f is set as explained in embodiment 5, so that the pressure of the central nozzle pipes 502c and 502d may be higher than the pressure of the other nozzle pipes, and the pressure of all nozzle pipes is adjusted so that the state of half-etching on the entire surface of the printed wiring board may be a state of uniform copper foil remainder 516 on the entire surface as shown in FIG. 17(*b*).

In this state, by etching at the conveying speed of 4.3 m/min in the basic setting condition, etching is realized in a state free from remainder of copper foil.

In pressure setting at this time, by etching at a conveying speed of 3.0 m/min on the printed wiring board having a copper thickness of 50 μm used in actual printed wiring board, the pressure of each nozzle pipe is finely adjusted again.

The condition of pressure setting at this time is supposed to be correction data A0.

(1-2) Analysis and Adjustment of Lower Surface Etching State

On the lower surface, too, when etched in the half-etching condition, same as on the upper surface, the stage generally becomes as shown in FIG. 17(*c*), and a strip of copper foil remainder 516 is formed parallel to the running direction of the printed wiring board.

This is the character of the etching apparatus on the lower surface, showing a fluctuation of etching force different from that on the upper surface.

The reason is that, when the printed wiring board on the feed roller 506 is seen from beneath, the rate of the feed roller 506 contacting with the printed wiring board differs as shown in FIG. 17(*d*), so that the portion larger in the rate of contacting with the feed roller 506 is formed as a strip of copper foil remainder 516 as shown in FIG. 17(*c*).

To eliminate this state, different from the case of the upper surface, in addition to the adjustment of pressure of each nozzle pipe for the lower surface, it is required to adjust the oscillating angle and oscillating speed of nozzle pipes. Conditions of all nozzle pipes are adjusted so that the half-etching state of the entire surface of the printed wiring board may be the state of uniform copper foil remainder 516 over the entire surface as shown in FIG. 17(*b*).

In this state, when etched at a conveying speed of about 4.3 m/min, etching can be executed in a state free from copper foil remainder.

In condition setting at this time, by etching at a conveying speed of about 3.0 m/min on the printed wiring board having a copper thickness of 50 μm used in actual printed wiring board, the pressure, oscillating angle and oscillating speed of each nozzle pipe is finely adjusted again.

The condition of setting of pressure, oscillating angle and oscillating speed of each nozzle pipe of the lower surface at this time is correction data B0.

Hitherto, to eliminate the character of the etching apparatus on the lower surface, it has been considered to exchange the feed roller 506 or adjust the roller pitch. However, such operation in the etching booth filled with vapor of etchant at high temperature of about 50° C. was dangerous and actually impossible.

The invention is capable of not only adjusting the pressure of each nozzle pipe individually, but also setting the oscillating mechanism independently, and it is possible to set the condition for eliminating the character of etching apparatus on the lower surface easily without actually touching the etchant.

(1-3) Analysis and Adjustment of Fluctuations of Upper and Lower Surfaces

In cases (1-1) and (1-2), fluctuations are adjusted individually on the upper and lower surfaces.

Herein, the fluctuation of etching force of the upper surface and lower surface is adjusted.

In this case, and in the adjustment of (1-1) and (1-2), it is preferred to adjust to the higher etching force. For example, supposing the etching conveying speed of the upper surface to be 3.0 m/min and the etching conveying speed of the lower surface to be 2.8 m/min, it is possible to adjust to raise the pressure of the lower surface nozzle pipes on the whole so that copper foil remainder may not occur on the lower surface at 3.0/min.

To set the condition again precisely, the technique of half-etching in (1) is applied on the printed wiring board of copper thickness of 50 μm, and the condition is finely adjusted by etching the upper and lower surfaces at the same time.

At the conveying speed of 3.0 m/min, the condition of the upper and lower surfaces is finely adjusted again.

At this time, the upper surface setting condition is correction data A1, and the lower surface condition setting is the correction data B1.

This condition setting refers to the whole surface etching, that is, the etching area is the same as the treating area of each division block, and the etching area rate (area to be etched/whole surface of printed wiring board) is 100% in each case.

(2) Analysis and Adjustment of Etching Force in Each Division Block

The setting procedure of conditions at various etching area rates and etching conditions at various etching area rates in each division block is explained below.

(2-1) Setting of Conditions at Various Etching Area Rates

In the printed wiring board for manufacture used in etching of actual printed wiring board, patterns of plural individual printed wiring boards (known as single printed wiring boards) are usually drawn in order to enhance the productivity, and therefore the etching area rate of each division block is the same in most cases.

The condition setting is explained below in the case of the same etching area rate of each division block and at different etching area rates.

The etching area rate of the highest frequency in actual case is mainly explained.

Generally, the etching area rate of printed wiring board varies with the type of the electronic appliance in which the printed wiring board is used, and the type of the electronic circuit to be used. In this example, the printed wiring board mainly used in digital signal circuit of mobile phone or personal computer is explained.

The etching area rates calculated from the CAD data of the printed wiring board are supposed to be 50%, 60%, and 40% in the order of frequency.

The drawing pattern of the etching resist used in etching is the checker pattern as shown in FIG. 18(*a*), the area is the same in the etching portion 517a and non-etching portion 517b, and the etching area rate is 50%.

In the case of the printed wiring board of high density of checker patterns (number of checker patterns per unit area), the condition should be set according to the example of high density shown in FIG. 18(*b*).

First, the etching conditions of upper surface and lower surface are set on the basis of the correction data A1 and correction data B1 set in (1).

By the etching resist pattern in FIG. 18(*a*) or FIG. 18(*b*), the printed wiring board having a copper thickness of 50 μm is etched in the above condition, and the state is checked.

Then, by the technique of experimental planning or other method, the etching condition for optimum condition is determined. At this time, the upper surface etching condition is correction data A2, and the lower surface etching condition is the correction data B2.

Similarly, when the etching portion 517a and non-etching portion 517b are different in area and the etching area rate is respectively 60% and 40%, the optimum etching condition is determined.

At the etching area rate of 60%, the upper surface etching condition is correction data A3, and the lower surface etching condition is the correction data B3, and at the etching area rate of 40%, the upper surface etching condition is correction data A4, and the lower surface etching condition is the correction data B4.

As required, in the case of 70% or 30%, the condition is similarly set, and the etching condition is determined.

(2-2) Etching Area Rate Differing in Each Division Block

Different from the case of (2-1), each division block differing in the etching area rate is explained.

In this case, too, at the etching area rates calculated from the actual CAD data of the printed wiring board, the condition is set in the case of the highest frequency.

Suppose the frequency is highest in the case shown in FIG. 19(a), and second highest in FIG. 19(b).

First, in the case shown in FIG. 19(a), the etching area rates of the division blocks 515a to 515f are respectively 60, 50, 50, 60, 50, and 50%, which is similar to the case of total etching area rate of 50% set in (2-1). Therefore, the etching condition is set as correction data A2 and correction data B2.

By the similar checker pattern to the etching pattern used in (2-1), and by the etching resist of each etching area rate of each division block is as shown in FIG. 19(a), the printed wiring board having a copper thickness of 50 μm is etched in the above condition, and the state is checked.

In this case, the division blocks 515a and 515d are 60% in etching area rate, being different from other division blocks of 50% in etching area rate, and on the basis of the condition setting of nozzle pipes 502a and 502d, the optimum etching conditions of other nozzle pipes are determined by the technique of experimental planning or other method.

At this time, the upper surface etching condition is correction data A5, and the lower surface etching condition is the correction data B5.

In the case shown in FIG. 19(b), too, the optimum etching condition is similarly determined, and at this time the upper surface etching condition is correction data A6, and the lower surface etching condition is the correction data B6.

As required, in other case, the condition is set similarly and the etching condition is determined as correction data.

(3) Automation of Etching Condition Setting

Automation of setting of etching condition of printed wiring board is explained.

Figure 20:
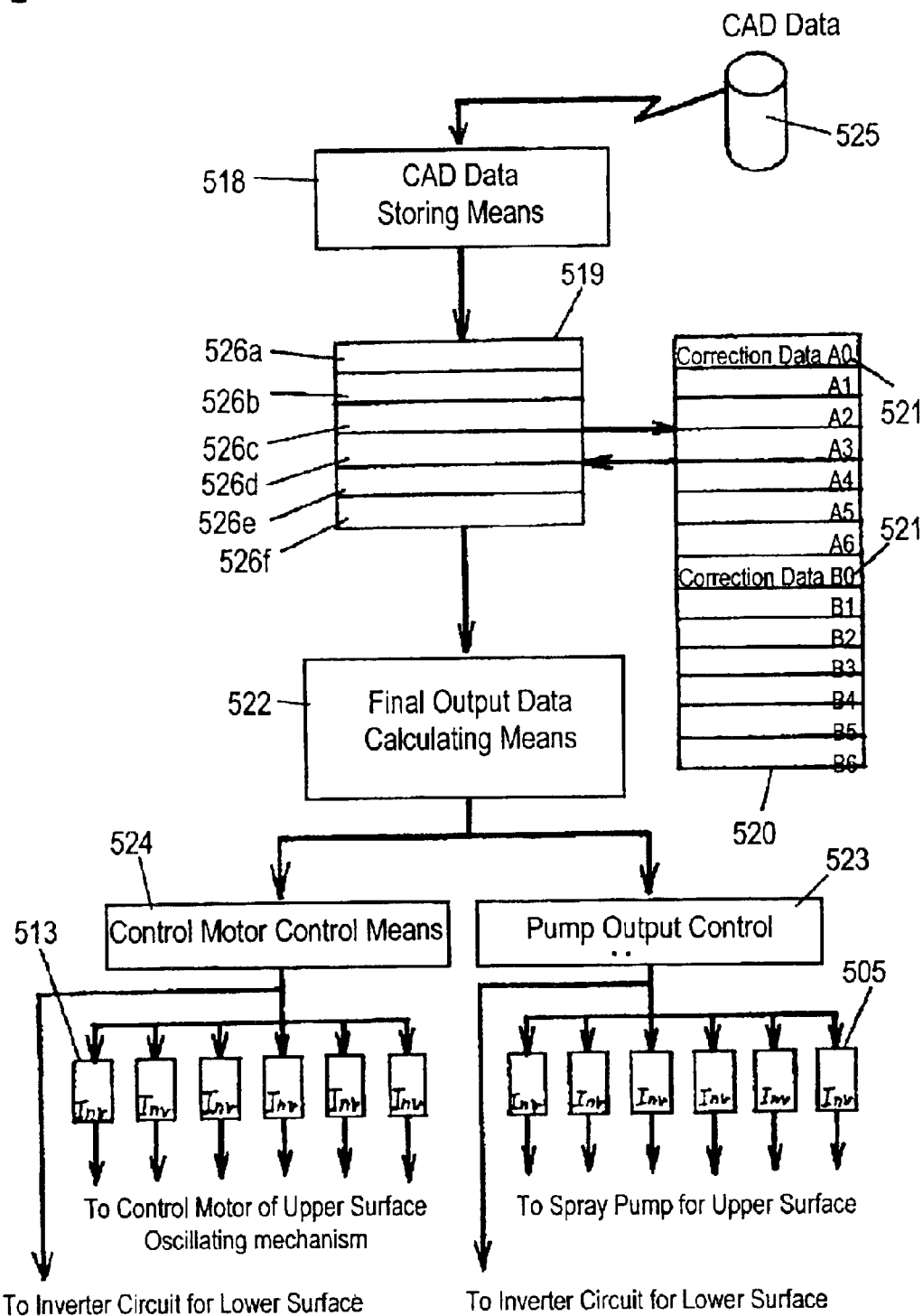
FIG. 20 is a flowchart showing automation of etching condition setting in embodiment 6 of the invention.
Figure 21:
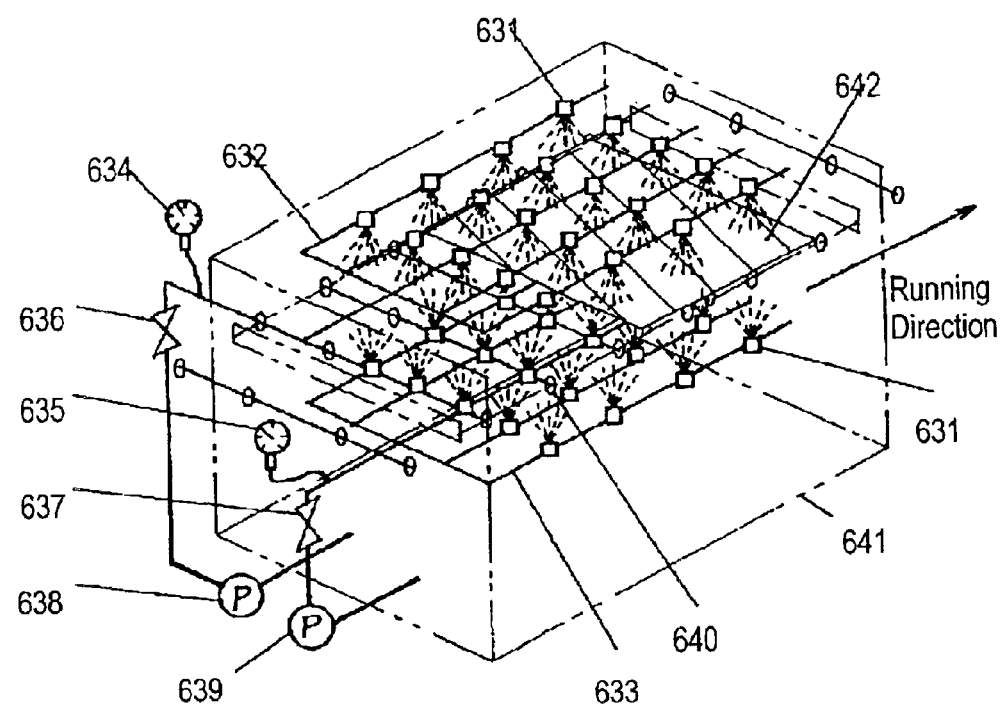
FIG. 21 is an outline diagram showing a conventional manufacturing apparatus of printed wiring board.

FIG. 20 is a flowchart showing automation of etching condition setting in embodiment 6 of the invention.

In FIG. 20, reference numeral 518 is means for storing the etching area as treating area in the CAD data, 519 is output data selecting means, 520 is correction data storing means of pump output and control motor, 621 is each correction data, 522 is final output data calculating means of individual pump outputs, 523 is pump output control means, 524 is control motor control means for controlling the rotating speed and rotating angle of the control motor, 525 is CAD data, and 526a to 526f are CAD data of each division block.

For specific explanation, the case of (2) shown in FIG. 19(a) is described.

CAD data 525 is stored in the CAD data storing means 518 as the etching area is calculated in each division block.

In the output data selecting means 519, the CAD data is stored as CAD data 526a to 526f of individual division blocks, and the etching area of each division block is judged to be the same or different, and the correction data corresponding to the etching area rate of each division block is selected from the correction data storing means 520, and the correction data is issued to final data calculating means 522. In the correction data storing means 520, the correction data set in the condition setting of (1) and (2) must be preliminarily stored.

In this example, the etching area rate of each division block is different, and the etching area rates of the CAD data 526a to 526f are respectively 60%, 50%, 50%, 60%, 50%, and 50%, and hence correction data A5 and correction data B5 are selected.

The outputs corresponding to the correction data A5 and correction data B5 are issued from the final output data calculating means 522 into the pump output control means 523 and control motor control means 524.

Consequently, the correction data A5 and correction data B5 entered in the final data calculating means 522 is separated into the pump output and control motor, and issued to the pump output control means 523 and control motor control means 524, respectively.

From these control means and through the inverter circuit 505 of spray pump and inverter circuit 513 corresponding to the control motor, the spray pump and control motor can be driven by the output corresponding to the spray pump pressure of each nozzle pipe and the output corresponding to the rotating speed of the control motor. As a result, automatic setting of etching conditions on the basis of CAD data is completed.

In this example, the control motor 510a shown in FIG. 15(a) is used, but the condition can be set automatically in the same method by using the stepping motor 510b shown in FIG. 15(b). In this case, the oscillating angle in the oscillating mechanism of each nozzle pipe can be also set automatically.

Further, in the embodiment of the invention, among the manufacturing apparatuses of printed wiring boards, the etching apparatus for etching of copper foil is explained, but the invention may be similarly applied also in the developing apparatus for developing and removing unexposed portions of photosensitive resist by using a developing solution as the treating solution.

The dimensions, pressures and other values cited in the foregoing embodiments are only examples, and are not limited.

(1) As explained herein, the invention presents a manufacturing apparatus of printed wiring board, in which the aperture of the nozzle pipe positioned in the center is larger than the aperture of the nozzle pipes at both sides, or the aperture of the piping pipe connected to the nozzle pipe in the center is larger than the aperture of the piping pipes at both sides.

Therefore, without lowering the productivity of etching of printed wiring board, the etching precision is uniform in the central area and peripheral area on the printed wiring board, and printed wiring boards of high density and high precision are manufactured at high yield, so that a simple manufacturing apparatus to be used widely can be presented without hiking the apparatus manufacturing cost.

(2) The invention is also capable of adjusting the spray pressure or flow rate of the central area, peripheral area, upper surface and lower surface of the printed wiring board in a simple method. Therefore, without lowering the productivity of etching of the printed wiring board, the etching precision is uniform in the central area and peripheral area, upper side and lower side on the printed wiring board, and printed wiring boards of high density and high precision are manufactured at high yield, so that a simple manufacturing apparatus to be used widely can be presented without hiking the apparatus manufacturing cost.

(3) According to the invention, further, by using the etching apparatus as the manufacturing apparatus of printed wiring board in which the mechanism for oscillating the nozzle pipes is an independent mechanism in each nozzle pipe, the oscillating angle of the nozzle pipe in the center is set smaller than the oscillating angle of the nozzle pipes at both sides, and the oscillating speed is larger, and it is designed to convey at a specified speed while blowing an etchant as the treating solution to the printed wiring board. Therefore, without lowering the productivity of etching of printed wiring board, the etching precision is uniform in the central area, peripheral area, upper surface and lower surface on the printed wiring board, and printed wiring boards of high density and high precision are manufactured at high yield, so that a simple manufacturing apparatus to be used widely can be presented without hiking the apparatus manufacturing cost.

(4) In the invention, moreover, by using a manufacturing apparatus of printed wiring board in which a pressure-proof flexible tube is placed between each nozzle pipe and pump, and the interval of individual nozzle pipes is variable, and is also variable in the vertical direction, the nozzle pipes are oscillated at specified oscillating angle and oscillating speed, and the printed wiring board is etched by conveying at a specified speed while blowing an etchant as the treating solution to the printed wiring board. Therefore, without lowering the productivity of etching of printed wiring board, the etching precision is uniform in the central area, peripheral area, upper surface and lower surface on the printed wiring board, and printed wiring boards of high density and high precision are manufactured at high yield, so that a simple manufacturing apparatus to be used widely can be presented without hiking the apparatus manufacturing cost.

(5) In the configuration of the manufacturing apparatus of printed wiring board of the invention, since the spray pressure, oscillating angle and oscillating speed can be set in each nozzle pipe, the etching precision is uniform in the upper surface and lower surface on the printed wiring board, and printed wiring boards of high density and high precision are manufactured at high yield.

Further, a simple and widely acceptable manufacturing apparatus of printed wiring board capable of setting the etching conditions automatically depending on the etching area can be presented.

I claim:

1. A manufacturing apparatus of manufacturing a printed wiring board, comprising:
    a feed roller for conveying a printed wiring board;
    a plurality of nozzle pipes each having a plurality of spray nozzles mounted thereon;
    an oscillating mechanism for oscillating the nozzle pipes;
    a pump for supplying a treating solution to the nozzle pipes;
    pressure-proof flexible tubes disposed between the nozzle pipes and the pump, respectively;
    first support members for supporting the nozzle pipes capable of being oscillated, respectively, the nozzle pipes penetrating the first support members;
    second support members for supporting the first support members movably in a specific direction, respectively;
    a supporting mechanism for supporting the second support members movably in a vertical direction to the specific direction;
    first flexible bellows members disposed at the second support members at both sides of the first support members, for covering a region where each of the first support members moves; and
    second flexible bellows members disposed at both sides of the second support members, for covering regions where the second support members move.

2. A manufacturing apparatus of manufacturing a printed wiring board, comprising:
    a feed roller for conveying a printed wiring board;
    plurality of nozzle pipes each having a plurality of spray nozzles mounted thereon;
    an oscillating mechanism for oscillating the nozzle pipes;
    a pump for supplying a treating solution to the nozzle pipes;
    pressure-proof flexible tubes disposed between the nozzle pipes and the pump, respectively;
    wherein the oscillating mechanism oscillates the nozzle pipes independently;
    wherein the oscillating mechanism comprises:
        cams;
        link mechanisms; and
        control motors; and
    flexible wires for coupling the oscillating mechanism and the nozzle pipes, respectively.

3. A manufacturing apparatus of manufacturing a printed wiring board, comprising:
    a feed roller for conveying a printed wiring board;
    a plurality of nozzle pipes each having a plurality of spray nozzles mounted thereon;
    an oscillating mechanism for oscillating the nozzle pipes;
    a pump for supplying a treating solution to the nozzle pipes;
    pressure-proof flexible tubes disposed between the nozzle pipes and the pump, respectively
    first support members for supporting the nozzle pipes capable of being oscillated, respectively, the nozzle pipes penetrating the first support members;
    second support members for supporting the first support members movably in a specific direction, respectively;
    a supporting mechanism for supporting the second support members movably in a vertical direction to the specific direction;
    moving means for moving the first and second support members;
    control means for controlling the moving means to control moving positions of the first and second supporting means;
    means for storing dimension data of the printed wiring board; and
    a passage supplying the dimension data to the control means.

4. A method of manufacturing a printed wiring board using a manufacturing apparatus which includes:
    a feed roller for conveying a printed wiring board;
    a plurality of nozzle pipes each having a plurality of spray nozzles mounted thereon;
    an oscillating mechanism for oscillating the nozzle pipes;
    a pump for supplying a treating solution to the nozzle pipes;

pressure-proof flexible tubes disposed between the nozzle pipes and the pump, respectively;

first support members for supporting the nozzle pipes capable of being oscillated, respectively, the nozzle pipes penetrating the first support members;

second support members for supporting, the first support members movably in a specific direction, respectively;

a supporting mechanism for supporting the second support members movably in a vertical direction to the specific direction;

moving means for moving the first and second support members;

control means for controlling the moving means to control moving positions of the first and second supporting means;

means for storing dimension data of the printed wiring board; and a passage supplying the dimension data to the control means, said method comprising:

measuring dimension data of the printed circuit board in a vertical direction to a running direction of the printed wiring board;

inputting the dimension data to the means for storing dimension data;

setting an interval between the nozzle pipes according to the dimension data; and conveying the printed wiring board while oscillating the nozzle pipes and blowing the treating solution to the printed wiring board.

5. The method of claim 4, wherein the treating solution is an etchant.

6. A manufacturing apparatus of manufacturing a printed wiring board, comprising:

a feed roller for conveying a printed wiring board;

a plurality of nozzle pipes each having a plurality of spray nozzles mounted thereon;

an oscillating mechanism for oscillating the nozzle pipes;

a plurality of pumps for supplying a treating solution to the nozzle pipes, respectively;

pressure gauges disposed in passages between the nozzle pipes and the pumps, respectively;

one of an inverter circuit, current control circuit, and voltage control circuit for controlling outputs of the pumps;

wherein the oscillating mechanism oscillates the nozzle pipes independently;

wherein an oscillating angle and oscillating speed of the oscillating mechanism are variable;

means for storing treating area data of each of blocks into which the printed wiring board is divided at a dividing line in parallel with a running direction of the printed wiring board;

means for storing correction data for each of the nozzle pipes;

means for selecting selection data from the correction data;

means for calculating output data for the pumps from the selection data; and means for controlling outputs of the pumps according to the output data.

7. The manufacturing apparatus of claim 6, further comprising:

control motors for oscillating the nozzle pipes according to the output data, respectively; and means for controlling a rotating speed of each the control motors.

8. The manufacturing apparatus claim 7, wherein the correction data is an electric signal indicating a treating condition including at least one of a spray pressure, an oscillating speed, and an oscillating angle being set for each of the nozzle pipes.

9. The manufacturing apparatus of claim 8, wherein the means for storing the correction data stores a plurality of correction data corresponding to the treating area data.

10. The manufacturing apparatus of claim 6, further comprising:

stepping motors for oscillating the nozzle pipes according to the output data, respectively; and means for controlling a rotating angle or rotating speed of each of the stepping motors.

11. The manufacturing apparatus of claim 10, further comprising one of an inverter circuit, current control circuit, and voltage control circuit for controlling a rotating speed of each of the control motors.

12. The manufacturing apparatus of claim 10, further comprising a control/drive circuit for controlling a rotating angle or a rotating speed of each of the stepping motors.

13. The manufacturing apparatus claim 6, wherein means for controlling outputs of the pumps comprises one of inverter circuits, current control circuits, and voltage control circuits for controlling outputs of the pumps, respectively.

14. A method of manufacturing a printed wiring board using a manufacturing apparatus which includes:

a feed roller for conveying a printed wiring board;

a plurality of nozzle pipes each having a plurality of spray nozzles mounted thereon;

an oscillating mechanism for oscillating the nozzle pipes;

a plurality of pumps for supplying a treating solution to the nozzle pipes, respectively;

a plurality of pressure gauges disposed in passages between the nozzle pipes and the pumps, respectively;

means for storing treating area data of each of blocks into which the printed wiring board is divided at a dividing line in parallel with a running direction of the printed wiring board;

means for storing correction data for each of the nozzle pipes;

means for selecting selection data from the correction data;

means for calculating output data for the pumps from the selection data; and means for controlling an output of each of the pumps according to the output data, said method comprising:

calculating the treating area data of each of the blocks from CAD data for drawing a wiring pattern on the printed wiring board;

inputting the treating area data into the means for storing treating area data; and conveying the printed wiring board while oscillating the nozzle pipes and blowing the treating solution to the printed wiring board.

15. The method of claim 14, wherein the treating solution is an etchant.

16. A method of manufacturing a printed wiring board using a manufacturing apparatus which includes:

a feed roller for conveying a printed wiring board;

a plurality of nozzle pipes each having a plurality of spray nozzles mounted thereon;

an oscillating mechanism for oscillating the nozzle pipes;

a plurality of pumps for supplying a treating solution to the nozzle pipes, respectively;

a plurality of pressure gauges disposed in passages between the nozzle pipes and the pumps, respectively;

means for storing treating area data of each of blocks into which the printed wiring board is divided at a dividing line in parallel with a running direction of the printed wiring board;

means for storing correction data for each of the nozzle pipes;

means for selecting selection data from the correction data;

means for calculating output data for the pumps from the selection data;

means for controlling an output of each of the pumps according to the output data;

control motors for oscillating the nozzle pipes according to the output data, respectively; and means for controlling a rotating speed of each of the control motors, said method comprising:

calculating treating area data of each of the blocks from CAD data for drawing a wiring pattern on the printed wiring board;

inputting the treating area data to the means for storing treating area data; and conveying the printed wiring board while oscillating the nozzle pipes and blowing the treating solution to the printed wiring board.

17. The method of claim 16, wherein the treating solution is an etchant.

18. A method of manufacturing a printed wiring board using a manufacturing apparatus which includes:

a feed roller for conveying a printed wiring board;

a plurality of nozzle pipes each having a plurality of spray nozzles mounted thereon;

an oscillating mechanism for oscillating the nozzle pipes;

a plurality of pumps for supplying a treating solution to the nozzle pipes, respectively;

a plurality of pressure gauges disposed in passages between the nozzle pipes and the pumps, respectively;

means for storing treating area data of each of blocks into which the printed wiring board is divided at a dividing line in parallel with a running direction of the printed wiring board;

means for storing correction data for each of the nozzle pipes;

means for selecting selection data from the correction data;

means for calculating output data for the pumps from the selection data;

means for controlling an output of each of the pumps according to the output data;

stepping motors for oscillating the nozzle pipes according to the output data, respectively; and means for controlling a rotating angle or a rotating speed of the stepping motors, said method comprising:

calculating treating area data of each blocks from CAD data for drawing a wiring pattern on the printed wiring board;

inputting the treating area data to the means for storing treating area data; and conveying the printed wiring board while oscillating the nozzle pipes and blowing the treating solution to the printed wiring board.

19. The method of claim 18, wherein the treating solution is an etchant.

* * * * *

UNITED STATES PATENT AND TRADEMARK OFFICE
CERTIFICATE OF CORRECTION

PATENT NO. : 6,918,989 B2
DATED : July 19, 2005
INVENTOR(S) : Kazutomo Higa

It is certified that error appears in the above-identified patent and that said Letters Patent is hereby corrected as shown below:

<u>Column 30,</u>
Line 22, "said method comprising:" should begin as a new paragraph between lines 22 and 23.

Signed and Sealed this

Tenth Day of January, 2006

JON W. DUDAS
*Director of the United States Patent and Trademark Office*